US008899289B2

(12) United States Patent
Deguchi et al.

(10) Patent No.: US 8,899,289 B2
(45) Date of Patent: Dec. 2, 2014

(54) JOINT METHOD, JOINT APPARATUS AND JOINT SYSTEM

(75) Inventors: Masatoshi Deguchi, Kumamoto (JP); Masatoshi Shiraishi, Kumamoto (JP); Shinji Okada, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 121 days.

(21) Appl. No.: 13/613,050

(22) Filed: Sep. 13, 2012

(65) Prior Publication Data

US 2013/0071996 A1    Mar. 21, 2013

(30) Foreign Application Priority Data

Sep. 16, 2011    (JP) .................................. 2011-203080

(51) Int. Cl.
| B29C 65/00 | (2006.01) |
| G05G 15/00 | (2006.01) |
| B23K 31/00 | (2006.01) |
| H01L 21/30 | (2006.01) |
| H01L 21/687 | (2006.01) |
| H01L 21/67 | (2006.01) |
| H01L 21/18 | (2006.01) |
| B32B 38/00 | (2006.01) |
| H01L 21/683 | (2006.01) |
| B32B 38/18 | (2006.01) |

(52) U.S. Cl.
CPC ...... *H01L 21/6715* (2013.01); *H01L 21/68707* (2013.01); *B32B 2309/02* (2013.01); *H01L 21/67109* (2013.01); *B32B 2457/14* (2013.01); *H01L 21/68742* (2013.01); *H01L 21/187* (2013.01); *B32B 2038/1891* (2013.01); *B32B 2457/20* (2013.01); *H01L 21/67126* (2013.01); *B32B 38/0036* (2013.01); *B32B 2309/62* (2013.01); *H01L 21/6719* (2013.01); *H01L 21/6838* (2013.01)

USPC .......... 156/349; 156/350; 156/358; 156/381; 228/180.1; 228/180.21; 438/455

(58) Field of Classification Search
USPC .......... 228/180.1, 180.21, 203, 228; 438/455, 438/800; 156/349, 350, 358, 381, 583.1; 29/738–740, 743
See application file for complete search history.

(56) References Cited

U.S. PATENT DOCUMENTS

| 2003/0164396 A1* | 9/2003 | Suga et al. ..................... 228/219 |
| 2011/0214809 A1* | 9/2011 | Sugiyama ..................... 156/285 |
| 2012/0214290 A1* | 8/2012 | Sugaya et al. ................ 438/455 |
| 2013/0062013 A1* | 3/2013 | Okada et al. .................. 156/322 |

FOREIGN PATENT DOCUMENTS

| JP | H02-123726 A | 5/1990 |
| JP | H07-254545 A | 10/1995 |
| JP | H09-320913 A | 12/1997 |
| JP | A-2008-182016 | 8/2008 |

* cited by examiner

*Primary Examiner* — Hsien Ming Lee
(74) *Attorney, Agent, or Firm* — Posz Law Group, PLC

(57) ABSTRACT

When joining a processing target substrate and a supporting substrate together by suction-holding the processing substrate and the supporting substrate respectively on a first holding unit and a second holding unit arranged to face each other and pressing the second holding unit toward the first holding unit while heating the substrates by heating mechanisms of the holding units, the present invention preheats at least the processing target substrate before suction-holding the processing target substrate on the first holding unit to suppress generation of particles when joining the processing target substrate and the supporting substrate together so as to properly perform the joining of the processing target substrate and the supporting substrate.

15 Claims, 23 Drawing Sheets

JOINT METHOD, JOINT APPARATUS AND JOINT SYSTEM

BACKGROUND OF THE INVENTION

1. Field of the Invention

The present invention relates to a joint method of joining a processing target substrate and a supporting substrate together, a joint apparatus performing the joint method, and a joint system including the joint apparatus.

2. Description of the Related Art

In recent years, for example, in a manufacturing process of a semiconductor device, the diameter of a semiconductor wafer (hereinafter, referred to as a "wafer") increasingly becomes larger. Further, the wafer is required to be thinner in a specific process such as packaging. For example, when a thin wafer with a large diameter is transferred or subjected to polishing processing as it is, warpage or break can occur in the wafer. Therefore, in order to reinforce the wafer, for example, bonding the wafer to a wafer being a supporting substrate or a glass substrate is performed.

The bonding of the wafer and the supporting substrate is performed by intervening an adhesive between the wafer and the supporting substrate using, for example, a bonding apparatus. The bonding apparatus has, for example, a first holding member that holds the wafer, a second holding member that holds the supporting substrate, a heating mechanism that heats the adhesive disposed between the wafer and the supporting substrate, and a moving mechanism that moves at least the first holding member or the second holding member in the vertical direction. In the bonding apparatus, the adhesive is supplied between the wafer and the supporting substrate and heated, and then the wafer and the supporting substrate are pressed to be joined together (Japanese Laid-open Patent Publication No. 2008-182016).

However, in the case of using the above-described conventional bonding apparatus, the wafer at room temperature will be also rapidly heated when heating the adhesive. Thus, the wafer thermally expands and the wafer and the first holding member rub against each other to generate particles. Due to the particles, the bonding of the wafer and the supporting substrate is not properly performed in some cases.

SUMMARY OF THE INVENTION

The present invention has been made in view of the above points and its object is to suppress generation of particles when a processing target substrate and a supporting substrate are joined together so as to properly perform joining of the processing target substrate and the supporting substrate.

To achieve the above object, the present invention is a joint method of joining a processing target substrate and a supporting substrate together by suction-holding the processing substrate and the supporting substrate respectively on a first holding unit and a second holding unit arranged to face each other and pressing the second holding unit toward the first holding unit while heating the substrates by heating mechanisms of the holding units, the method including preheating at least the processing target substrate before suction-holding the processing target substrate on the first holding unit.

According to the present invention, the processing target substrate is preheated, so that the thermal expansion of the processing target substrate can be suppressed even when the processing target substrate is than suction-held on the first holding unit. Therefore, it is possible to suppress particles generated by rubbing of the processing target substrate and the first holding unit against each other in the case where the preheated processing target substrate is heated by the first holding unit more than in the conventional case where the processing target substrate at room temperature is heated by the first holding unit. Therefore, the joining of the processing target substrate and the supporting substrate can be properly performed.

The present invention according to another aspect is a joint apparatus including a first holding unit that suction-holds a processing target substrate and a second holding unit that is arranged to face the first holding unit and suction-holds a supporting substrate and joining the processing target substrate and the supporting substrate together by pressing the second holding unit toward the first holding unit while heating the substrates by heating mechanisms of the holding units, the apparatus including a preheating unit that preheats at least the processing target substrate before the processing target substrate is suction-held on the first holding unit.

The present invention according to still another aspect is a joint system including a processing station and a transfer-in/out station that transfers a processing target substrate, a supporting substrate, or a superposed substrate in which the processing target substrate and the supporting substrate are joined together into/out of the processing station, wherein the processing station includes:

the joint apparatus;

a coating apparatus that applies an adhesive to the processing target substrate or the supporting substrate;

a thermal processing apparatus that heats the processing target substrate or the supporting substrate to which the adhesive has been applied to a predetermined temperature; and a transfer region for transferring the processing target substrate, the supporting substrate, or the superposed substrate, to the coating apparatus, the thermal processing apparatus, and the joint apparatus.

According to the present invention, it is possible to suppress generation of particles when a processing target substrate and a supporting substrate are joined together so as to properly perform joining of the processing target substrate and the supporting substrate.

DETAILED DESCRIPTION OF THE INVENTION

Figure 1:
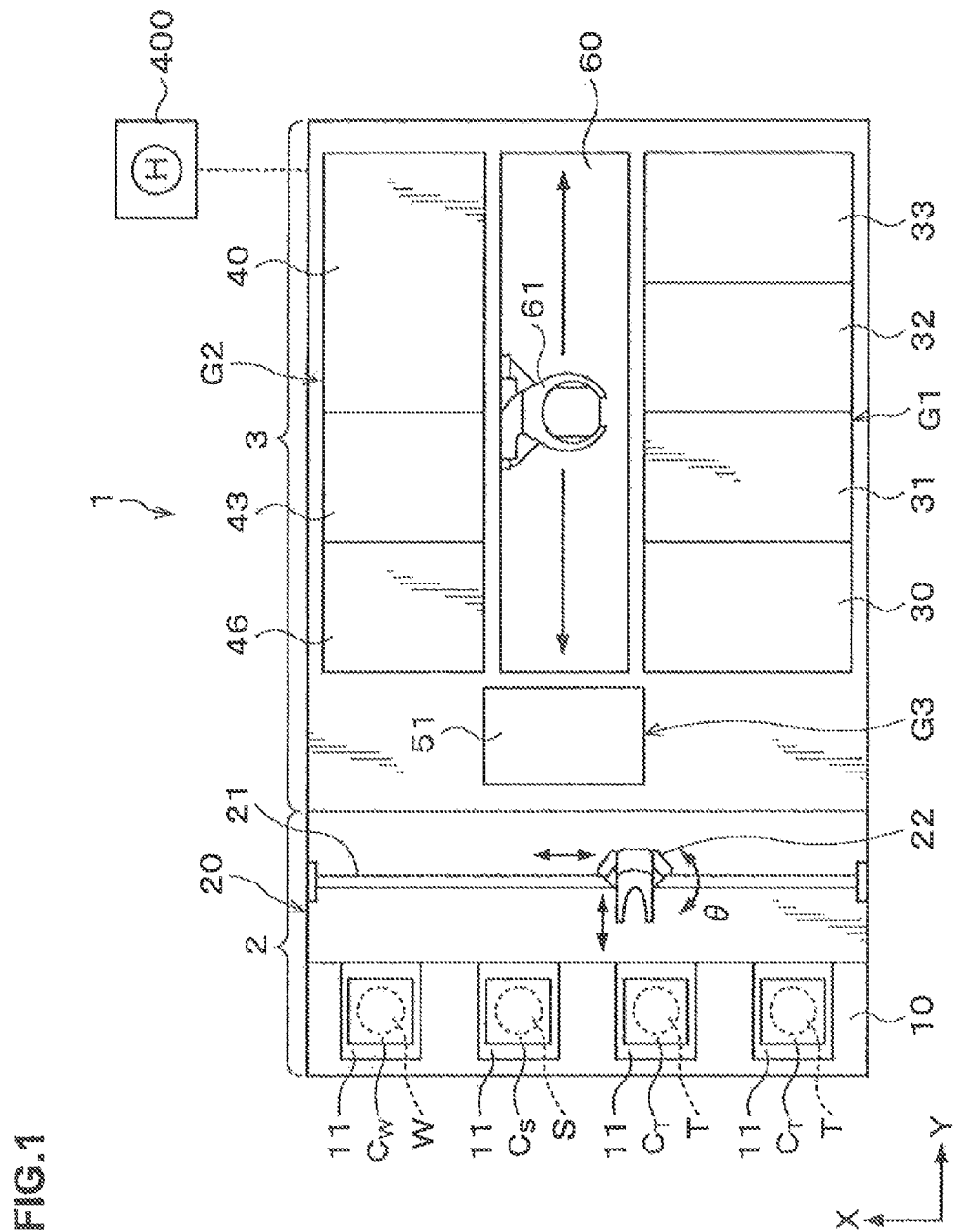
FIG. 1 is a plan view illustrating the outline of a configuration of a joint system according to this embodiment.
Figure 2:
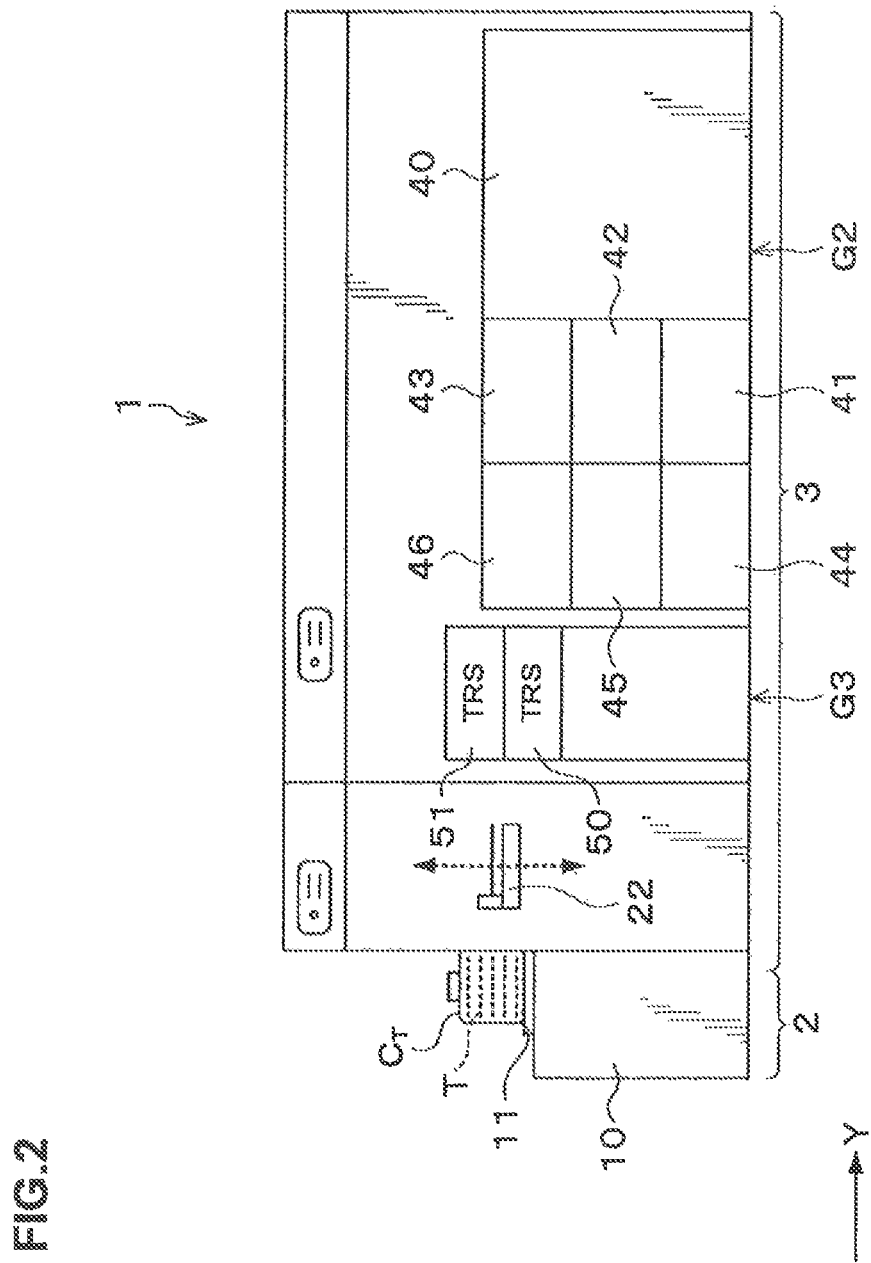
FIG. 2 is a side view illustrating the outline of the internal configuration of the joint system according to this embodiment.

Hereinafter, embodiments of the present invention will be described. FIG. 1 is a plan view illustrating the outline of a configuration of a joint system 1 according to this embodiment. FIG. 2 is a side view illustrating the outline of the internal configuration of the joint system 1.

Figure 3:
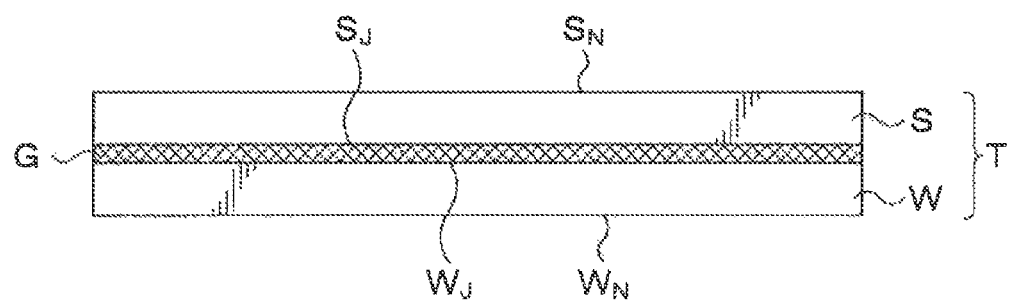
FIG. 3 is a side view of a processing target wafer and a supporting wafer.

In the joint system 1, for example, a processing target wafer W as a processing target substrate and a supporting wafer S as a supporting substrate are joined together, for example, via an adhesive G as illustrated in FIG. 3. Hereinafter, in the processing target wafer W, the surface to be joined with the supporting wafer S via the adhesive G is referred to as a "joint surface $W_J$" as a front surface and the surface opposite to the joint surface $W_J$ is referred to as a "non-joint surface $W_N$" as a rear surface. Similarly, in the supporting wafer S, the surface to be joined with the processing target wafer W via the adhesive G is referred to as a "joint surface $S_J$" as a front surface and the surface opposite to the joint surface $S_J$ is referred to as a "non-joint surface $S_N$" as a rear surface. Then, in the joint system 1, the processing target wafer W and the supporting wafer S are joined together to form a superposed wafer T as a superposed substrate. Note that the processing target wafer W is a wafer which will be a product in which a plurality of electronic circuits have been formed, for example, on the joint surface $W_J$, and the non-joint surface $W_N$ is subjected to polishing processing. The supporting wafer S is a wafer which has the same diameter as that of the processing target wafer W and supports the processing target wafer W. Note that a case of using a wafer as the supporting substrate will be described in this embodiment, but another substrate such as, for example, a glass substrate or the like may be used.

The joint system 1 has, as illustrated in FIG. 1, a configuration in which a transfer-in/out station 2 into/from which cassettes $C_W$, $C_S$, $C_T$ capable of housing a plurality of processing target wafers W, a plurality of supporting wafers S, and a plurality of superposed wafers T respectively are transferred from/to the outside, and a processing station 3 including various processing and treatment apparatuses that perform predetermined processing and treatment on the processing target wafer W, the supporting wafer S, the superposed wafer T are integrally connected.

In the transfer-in/out station 2, a cassette mounting table 10 is provided. On the cassette mounting table 10, a plurality of, for example, four cassette mounting plates 11 are provided. The cassette mounting plates 11 are arranged side by side in a line in an X-direction (a top-bottom direction in FIG. 1). On the cassette mounting plates 11, the cassettes $C_W$, $C_S$, $C_T$ can be mounted when the cassettes $C_W$, $C_S$, $C_T$ are transferred in/out from/to the outside of the joint system 1. As described above, the transfer-in/out station 2 is configured to be capable of holding the plurality of processing target wafers W, the plurality of supporting wafers S, and the plurality of superposed wafers T. Note that the number of cassette mounting plates 11 is not limited to this embodiment but can be arbitrarily determined. Further, one cassette may be used for collecting defective wafers. In other words, the cassette is a cassette that is capable of separating wafers having defects in jointing the processing target wafer and the supporting wafer S occurred due to various causes, from other normal superposed wafers T. In this embodiment, one cassette $C_T$ among the plurality of cassettes $C_T$ is used for collecting the defective wafers, and the other cassettes $C_T$ are used for housing normal superposed wafers T.

In the transfer-in/out station 2, a wafer transfer apparatus 20 is provided adjacent to the cassette mounting table 10. In the wafer transfer apparatus 20, a wafer transfer apparatus 22 movable on a transfer path 21 extending in the X-direction is provided. The wafer transfer apparatus 22 is movable also in the vertical direction and around the vertical axis (in a θ-direction) and thus can transfer the processing target wafer W, the supporting wafer S, the superposed wafer T between the cassettes $C_W$, $C_S$, $C_T$ on the cassette mounting plates 11 and later-described transition apparatuses 50, 51 in a third processing block G3 in the processing station 3.

In the processing station 3, a plurality of, for example, three processing blocks G1, G2, G3 each including various kinds of processing and treatment apparatuses are provided. For example, the first processing block G1 is provided, for example, on the front side in the processing station 3 (on an X-direction negative direction side in FIG. 1), and the second processing block G2 is provided on the back side in the processing station 3 (on an X-direction positive direction side in FIG. 1). Further, the third processing block G3 is provided on the transfer-in/out station 2 side in the processing station 3 (on a Y-direction negative direction side in FIG. 1).

For example, in the first processing block G1, joint apparatuses 30 to 33 each of which presses the processing target wafer W and the supporting wafer S via the adhesive G to join them together are provided side by side in the Y-direction in this order from the transfer-input station 2 side.

For example, in the second processing block G2, a coating apparatus 40 that applies the adhesive G to the processing target wafer W, thermal processing apparatuses 41 to 43 each of which heats the processing target wafer W having the adhesive G applied thereon to a predetermined temperature, and similar thermal processing apparatuses 44 to 46 are arranged side by side in this order in the direction toward the transfer-in/out station 2 side (in the Y-direction negative direction in FIG. 1) as illustrated in FIG. 2. The thermal processing apparatuses 41 to 43 and the thermal processing apparatuses 44 to 46 are stacked at three tiers in this order from the bottom. Note that the number and the arrangement in the vertical direction and in the horizontal direction of thermal processing apparatuses 41 to 46 to be installed can be arbitrarily set.

For example, in the third processing block G3, transition apparatuses 50, 51 for the processing target wafer W, the supporting wafer S, the superposed wafer T are stacked at two tiers in order from the bottom.

In an area surrounded by the first processing block G1 to the third processing block G3, a wafer transfer region 60 is formed as illustrated in FIG. 1. In the wafer transfer region 60, for example, a wafer transfer apparatus 61 is disposed. Note that the pressure inside the wafer transfer region 60 is equal to or higher than an atmospheric pressure, and transfer of the processing target wafer W, the supporting wafer S, the superposed wafer T in a so-called atmospheric system is performed in the wafer transfer region 60.

The wafer transfer apparatus 61 has a transfer arm movable, for example, in the vertical direction, the horizontal direction (a Y-direction, an X-direction), and around the vertical axis. The wafer transfer apparatus 61 can move in the wafer transfer region 60 to transfer the processing target wafer W, the supporting wafer S, the superposed wafer T to a predetermined apparatus in the first processing block G1, the second processing block G2, and the third processing block G3 therearound.

Figure 4:
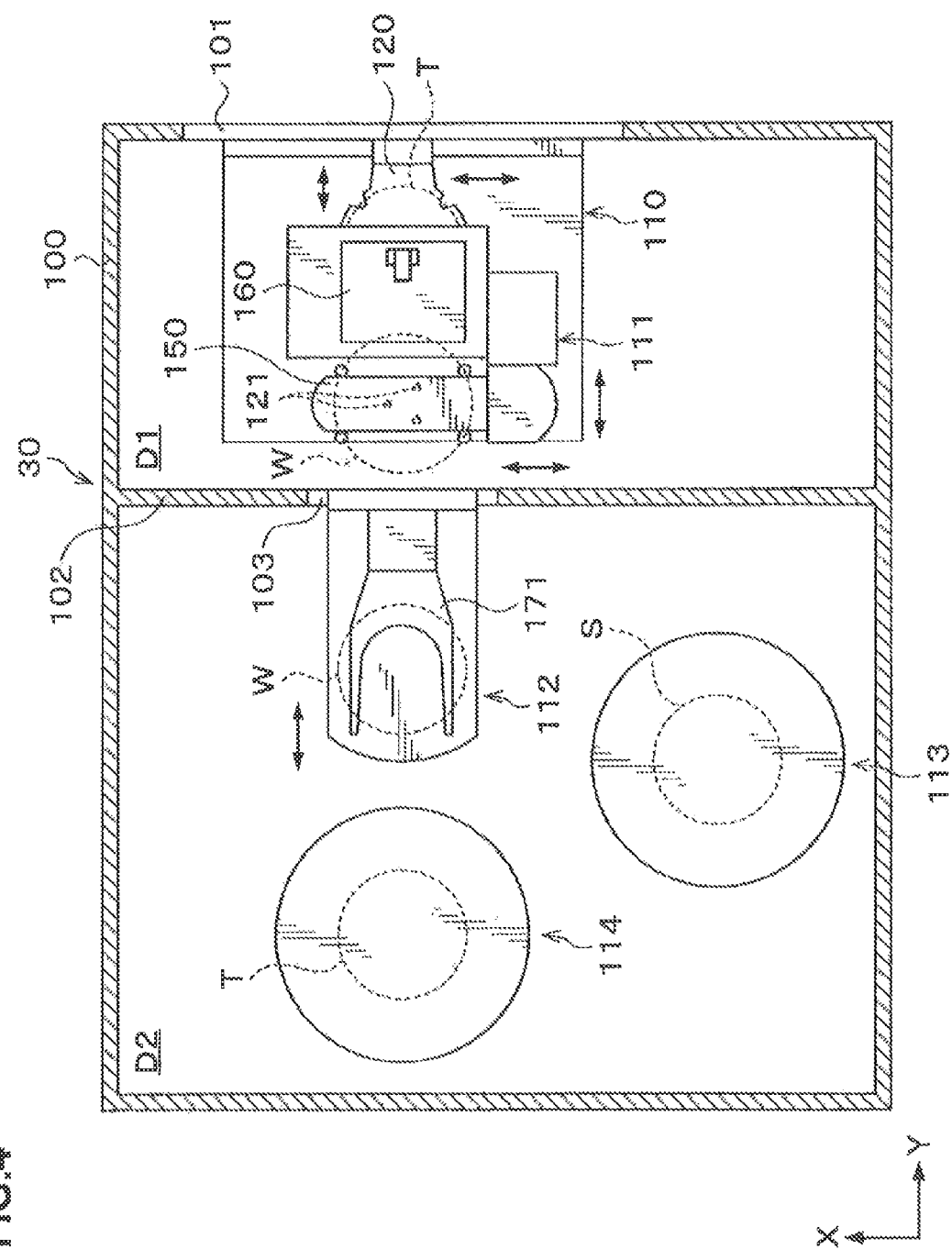
FIG. 4 is a transverse sectional view illustrating the outline of a configuration of a joint apparatus.

Next, the configurations of the aforementioned joint apparatuses 30 to 33 will be described. The joint apparatus 30 has a processing container 100 which can hermetically close the inside thereof as illustrated in FIG. 4. In the side surface of the processing container 100 on the wafer transfer region 60 side, a transfer-in/out port 101 for the processing target wafer W, the supporting wafer S, the superposed wafer T is formed, and an opening/closing shutter (not illustrated) is provided at the transfer-in/out port.

The inside of the processing container 100 is divided into a pre-processing region D1 and a joint region D2 by an inner wall 102. The aforementioned transfer-in/out port 101 is formed in the side surface of the processing container 100 in the pre-processing region D1. Also in the inner wall 102, a transfer-in/out port 103 for the processing target wafer W, the supporting wafer S, the superposed wafer T is formed.

In the pre-processing region D1, a delivery unit 110 for delivering the processing target wafer W, the supporting wafer S, the superposed wafer T to/from the outside of the joint apparatus 30 is provided. The delivery unit 110 is disposed adjacent to the transfer-in/out port 101. Further, a plurality of the delivery units 110 are stacked at a plurality of, for example, two tiers in the vertical direction as will be described later, and can delivery any two of the processing target wafer W, the supporting wafer S, the superposed wafer T at the same time. For example, one delivery unit 110 may deliver the processing target wafer W or the supporting wafer S before joining, and the other delivery unit 110 may deliver the superposed wafer T after joining. Alternatively, one delivery unit 110 may deliver the processing target wafer W before joining, and the other delivery unit 110 may deliver the supporting wafer S before joining.

On a Y-direction negative direction side in the pre-processing region D1, namely, the transfer-in/out port 103 side, a reversing unit 111 that reverses the front and rear surfaces, for example, of the supporting wafer S is provided vertically above the delivery unit 110. Note that the reversing unit 111 can adjust the orientation in the horizontal direction of the supporting wafer S and can also adjust the orientation in the horizontal direction of the processing target wafer W as will be described later.

On a Y-direction positive direction side in the joint region D2, a transfer unit 112 that transfers the processing target wafer W, the supporting wafer S, the superposed wafer T to the delivery unit 110, the reversing unit 111, and later-described preheating unit 113 and joint unit 114 is provided. The transfer unit 112 is attached at the transfer-in/out port 103.

On an X-direction negative direction side in the joint region D2, the preheating unit 113 that preheats the supporting wafer S to a predetermined temperature is provided.

On a Y-direction negative direction side in the joint region D2, the joint unit 114 that presses the processing target wafer W and the supporting wafer S via the adhesive G to join them together is provided.

Figure 5:
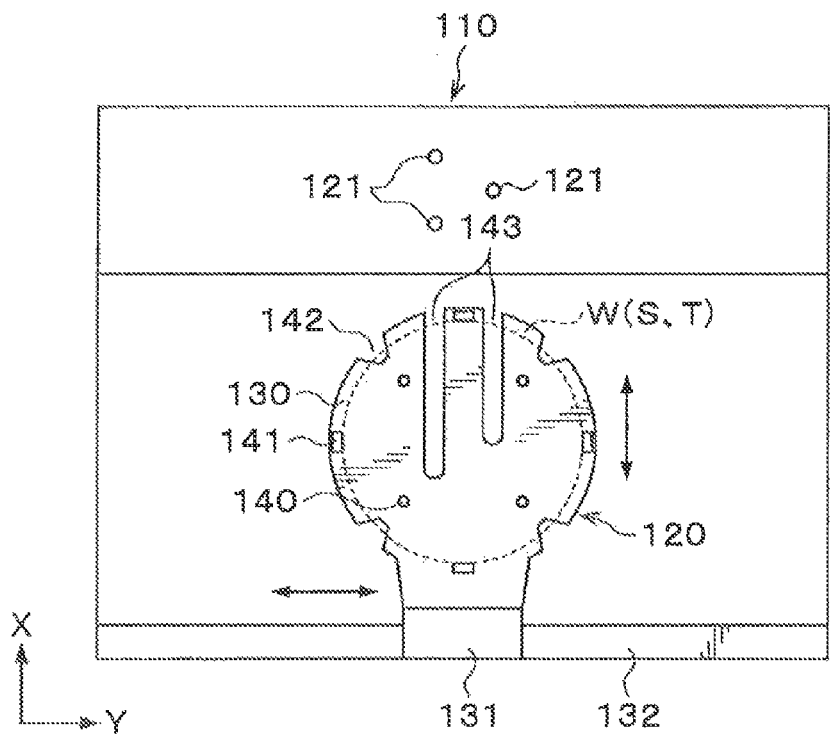
FIG. 5 is a plan view illustrating the outline of a configuration of a delivery unit.

Next, the configuration of the aforementioned delivery unit 110 will be described. The delivery unit 110 has a delivery arm 120 and wafer support pins 121 as illustrated in FIG. 5. The delivery arm 120 can deliver the processing target wafer W, the supporting wafer S, the superposed wafer T to/from the outside of the joint apparatus 30, namely, between the wafer transfer apparatus 61 and the wafer support pins 121. The wafer support pins 121 are provided at a plurality of, for example, three positions and can support the processing target wafer W, the supporting wafer S, the superposed wafer T.

The delivery arm 120 has an arm unit 130 that holds the processing target wafer W, the supporting wafer S, the superposed wafer T and an arm drive unit 131 equipped with, for example, a motor. The arm unit 130 has an almost disk shape. The arm drive unit 131 can move the arm unit 130 in an X-direction (a top-bottom direction in FIG. 5). Further, the arm drive unit 131 is attached to a rail 132 extending in a Y-direction (a right-left direction in FIG. 5) and configured to be movable on the rail 132. With this configuration, the delivery arm 120 is movable in the horizontal direction (the X-direction and the Y-direction), and can smoothly delivery the processing target wafer W, the supporting wafer S, the superposed wafer T between the wafer transfer apparatus 61 and the wafer support pins 121.

Figure 6:
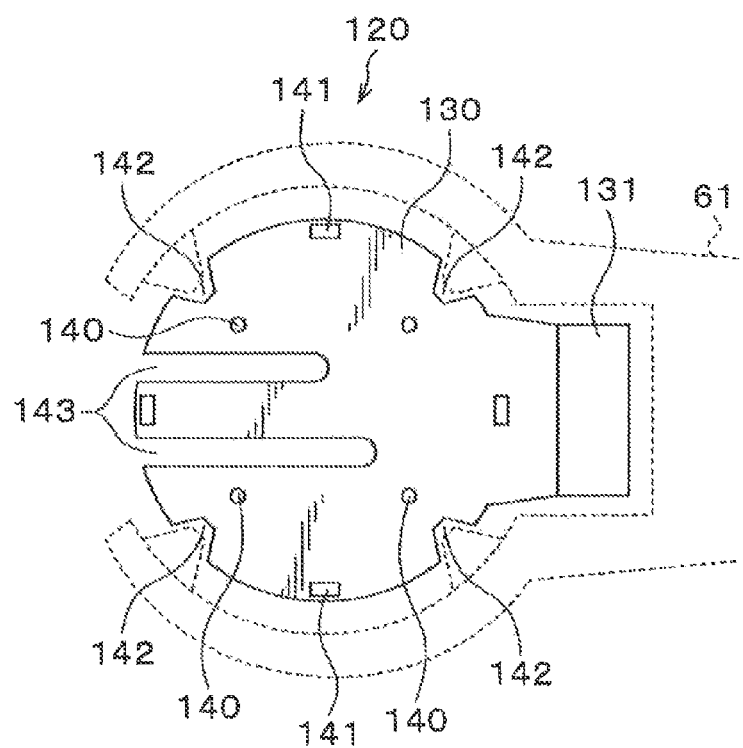
FIG. 6 is a plan view illustrating the outline of a configuration of a delivery arm.
Figure 7:
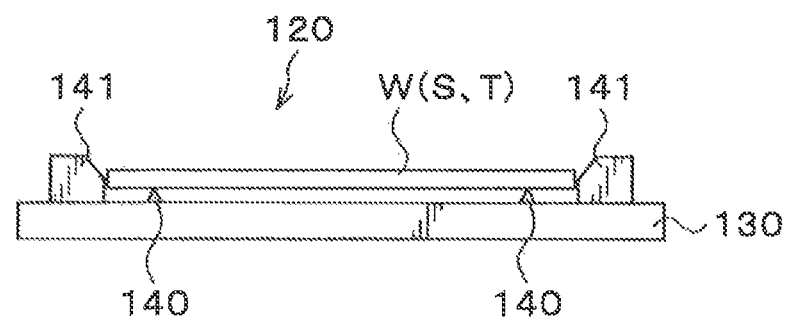
FIG. 7 is a side view illustrating the outline of the configuration of the delivery arm.

On the arm unit 130, wafer support pins 140 that support the processing target wafer W, the supporting wafer S, the superposed wafer T are provided at a plurality of, for example, four positions as illustrated in FIG. 6 and FIG. 7. Further, guides 141 that perform positioning of the processing target wafer W, the supporting wafer S, the superposed wafer T supported on the wafer support pins 140 are provided on the arm unit 130. The guides 141 are provided at a plurality of, for example, four positions to guide the side surface of the processing target wafer W, the supporting wafer S, the superposed wafer T.

At the outer periphery of the arm unit 130, cutouts 142 are formed, for example, at four positions as illustrated in FIG. 5 and FIG. 6. The cutouts 142 make it possible to prevent the transfer arm of the wafer transfer apparatus 61 from interfering with the arm unit 130 when the processing target wafer W, the supporting wafer S, the superposed wafer T is delivered from the transfer arm of the wafer transfer apparatus 61 to the delivery arm 120.

In the arm unit 130, two slits 143 are formed along the X-direction. The slits 143 are formed from the end face on the side of the wafer support pins 121 of the arm unit 130 to the vicinity of the middle portion of the arm unit 130. The slits 143 can prevent the arm unit 130 from interfering with wafer support pins 121.

Figure 8:
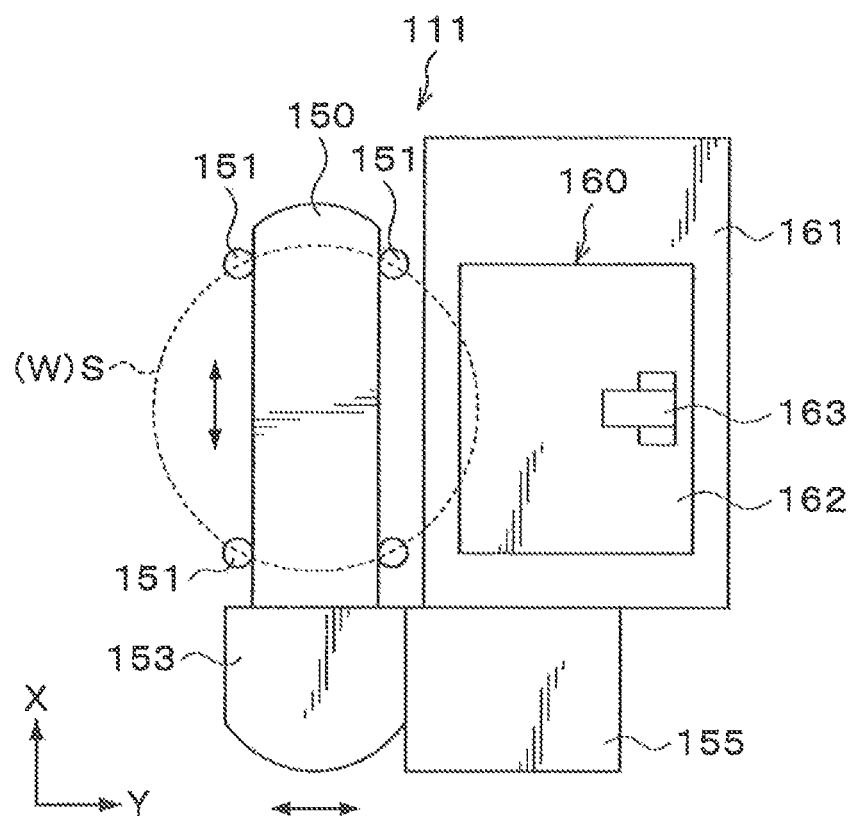
FIG. 8 is a plan view illustrating the outline of a configuration of a reversing unit.
Figure 9:
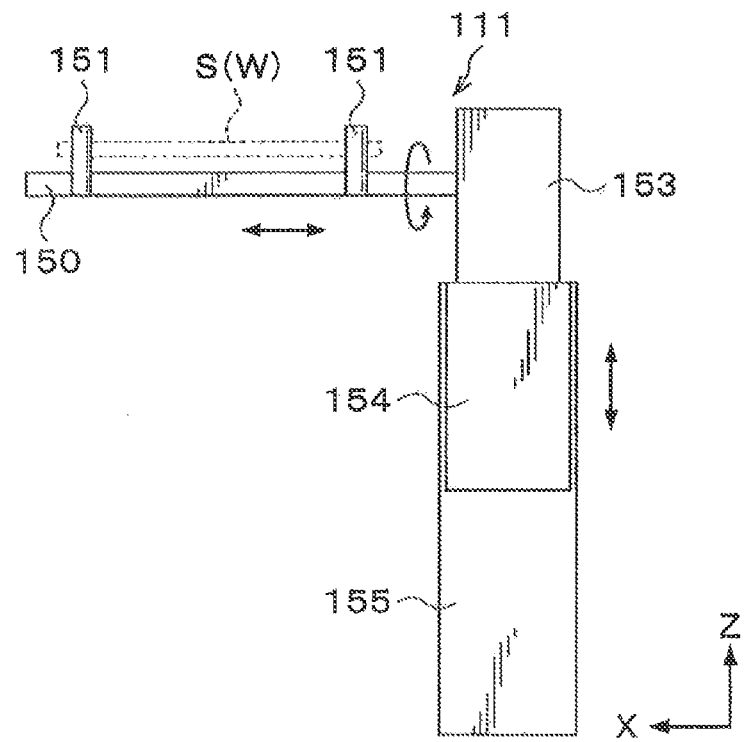
FIG. 9 is a side view illustrating the outline of the configuration of the reversing unit.
Figure 10:
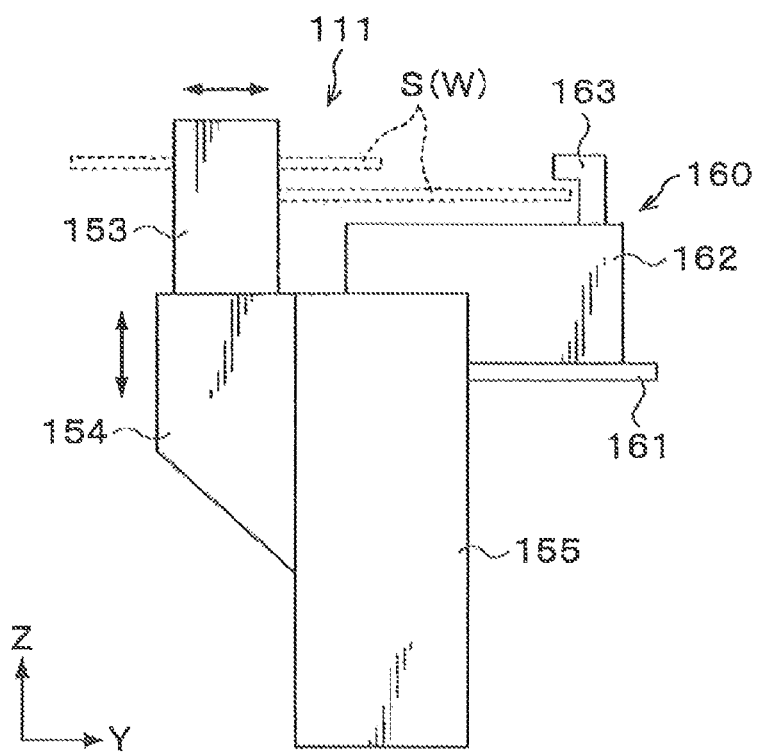
FIG. 10 is a side view illustrating the outline of the configuration of the reversing unit.
Figure 11:
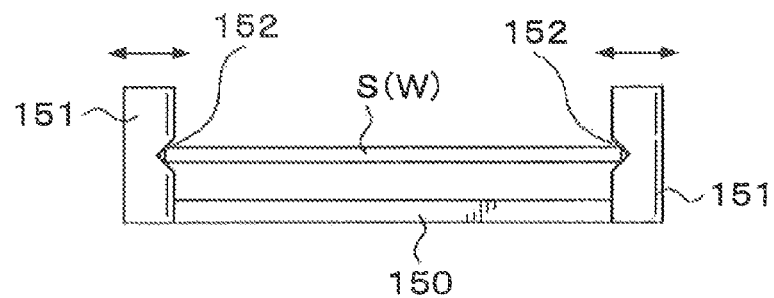
FIG. 11 is a side view illustrating the outline of configurations of a holding arm and holding members.

Next, the configuration of the aforementioned reversing unit 111 will be described. The reversing unit 111 has a holding arm 150 that holds the supporting wafer S, the processing target wafer W as illustrated in FIG. 8 to FIG. 10. The holding arm 150 extends in the horizontal direction (an X direction in FIG. 8 and FIG. 9). Further, at the holding arm 150, holding members 151 that hold the supporting wafer S, the processing target wafer W are provided, for example, at four positions. The holding members 151 are configured to be movable in the horizontal direction with respect to the holding arm 150 as illustrated in FIG. 11. In the side surface of the holding member 151, a cutout 152 for holding the outer peripheral portion of the supporting wafer S, the processing target wafer W is formed. The holding members 151 can hold the supporting wafer S, the processing target wafer W sandwiched between them.

The holding arm 150 is supported by a first drive unit 153 equipped with, for example, a motor as illustrated in FIG. 8 to FIG. 10. By means of the first drive unit 153, the holding arm 150 can freely turn around a horizontal axis and move in the horizontal direction (an X-direction in FIG. 8 and FIG. 9 and a Y-direction in FIG. 8 and FIG. 10). Note that the first drive unit 153 may move the holding arm 150 in the horizontal direction by rotating the holding arm 150 around the vertical axis. Below the first drive unit 153, a second drive unit 154 equipped with, for example, a motor is provided. By means of the second drive unit 154, the first drive unit 153 can move in the vertical direction along a support post 155 extending in the vertical direction. As described above, the supporting wafer S, the processing target wafer W held by the holding members 151 can be turned around the horizontal axis and moved in the vertical direction and the horizontal direction by the first drive unit 153 and the second drive unit 154.

A position adjusting mechanism 160 that adjusts the orientation in the horizontal direction of the supporting wafer S, the processing target wafer W held by the holding members 151 is supported on the support post 155 via a support plate 161. The position adjusting mechanism 160 is provided adjacent to the holding arm 150.

The position adjusting mechanism 160 has a base 162, and a detection unit 163 that detects the notch portion of the supporting wafer S, the processing target wafer W. Then, in the position adjusting mechanism 160, the orientation in the horizontal direction of the supporting wafer S, the processing target wafer W is adjusted by detecting the position of the notch portion of the supporting wafer S, the processing target wafer W by the detection unit 163 while moving the supporting wafer S, the processing target wafer W held by the holding members 151 in the horizontal direction to thereby adjust the position of the notch portion.

Figure 12:
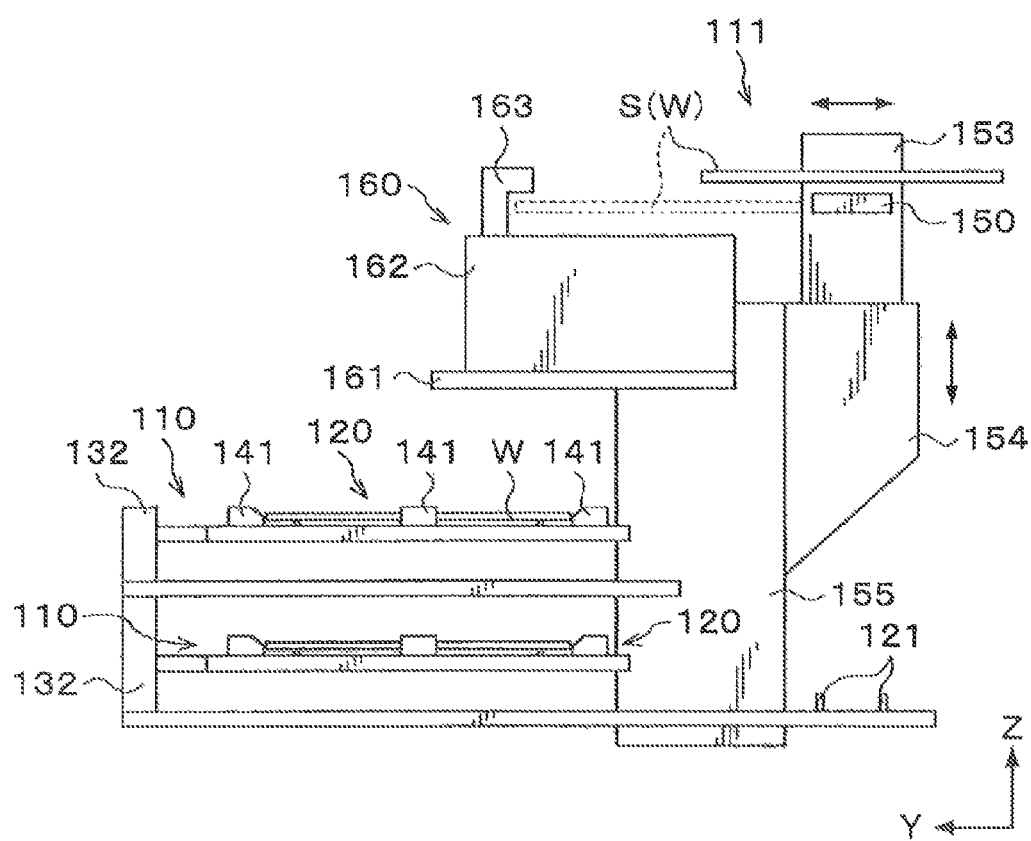
FIG. 12 is an explanatory view illustrating the positional relation between the delivery unit and the reversing unit.

Note that delivery units 110 configured as described above are disposed at two upper and lower tiers in the vertical direction as illustrated in FIG. 12, and the reversing unit 111 is disposed vertically above the delivery units 110. In other words, the delivery arms 120 of the delivery units 110 move in the horizontal direction below the holding arm 150 of the reversing unit 111 and the position adjusting mechanism 160. Further, the wafer support pins 121 of the delivery units 110 are disposed below the holding arm 150 of the reversing unit 111.

Figure 13:
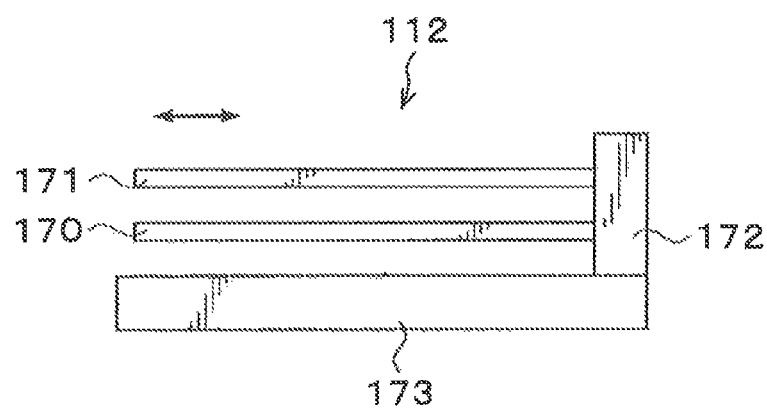
FIG. 13 is a side view illustrating the outline of a configuration of a transfer unit.

Next, the configuration of the aforementioned transfer unit 112 will be described. The transfer unit 112 has a plurality of, for example, two transfer arms 170, 171 as illustrated in FIG. 13. The first transfer arm 170 and the second transfer arm 171 are arranged at two tiers in this order from the bottom in the vertical direction. Note that the first transfer arm 170 and the second transfer arm 171 have different shapes as will be described later.

At base end portions of the transfer arms 170, 171, an arm drive unit 172 equipped with, for example, a motor is provided. By means of this arm drive unit 172, each of the transfer arms 170, 171 can independently move in the horizontal direction. The transfer arms 170, 171 and the arm drive unit 172 are supported on a base 173.

Figure 14:
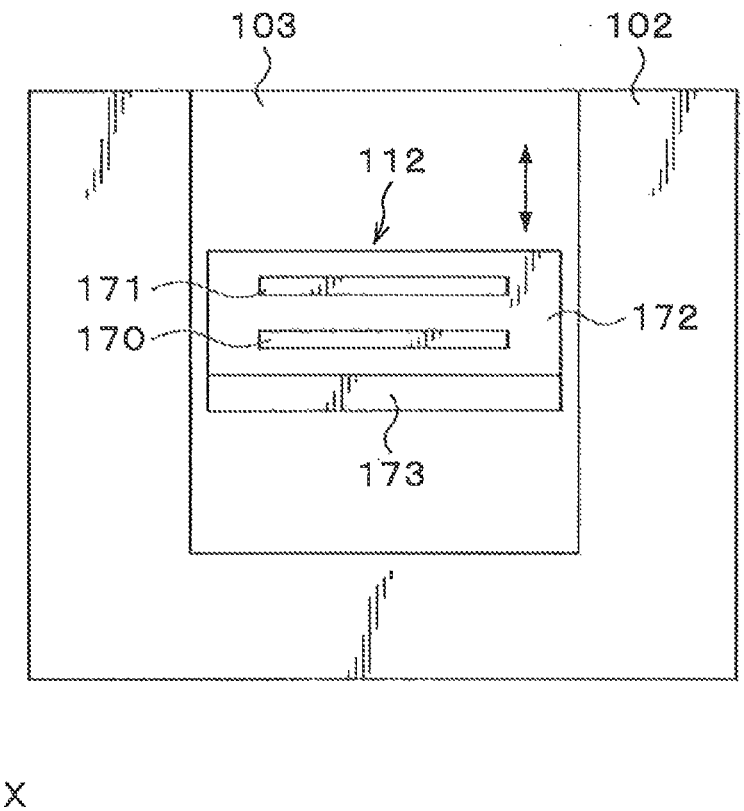
FIG. 14 is an explanatory view illustrating the appearance in which the transfer unit is disposed inside the joint apparatus.

The transfer unit 112 is provided at the transfer-in/out port 103 formed in the inner wall 102 of the processing container 100 as illustrated in FIG. 4 and FIG. 14. The transfer unit 112 can move in the vertical direction along the transfer-in/out port 103 by means of a drive unit (not illustrated) equipped with, for example, a motor.

The first transfer arm 170 transfers the processing target wafer W, the supporting wafer S, the superposed wafer T while holding the rear surface thereof (the non-joint surface $W_N$, $S_N$ in the processing target wafer W, the supporting wafer S). The first transfer arm 170 has an arm unit 180 having a tip branched off into two tip end parts 180a, 180a, and a support unit 181 integrally formed with the arm unit 180 and supporting the arm unit 180 as illustrated in FIG. 15.

Figure 15:
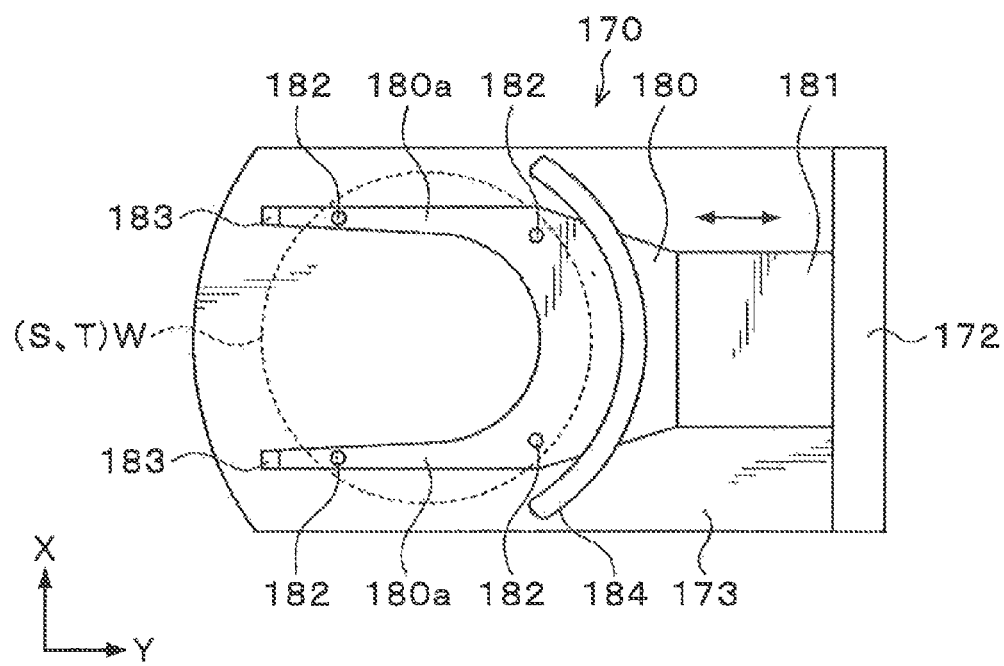
FIG. 15 is a plan view illustrating the outline of a configuration of a first transfer arm.
Figure 16:
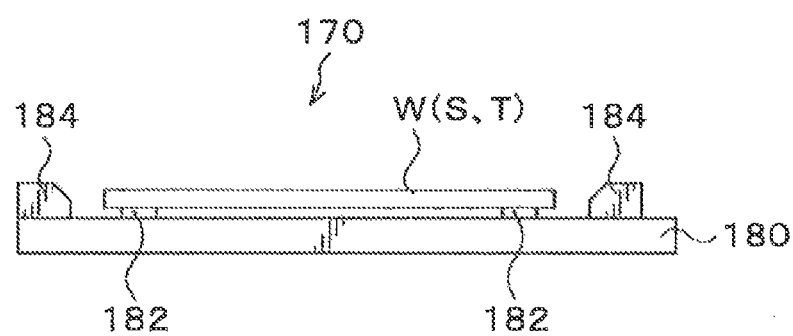
FIG. 16 is a side view illustrating the outline of the configuration of the first transfer arm.

On the arm unit 180, O-rings 182 made of resin are provided at a plurality of, for example, four positions as illustrated in FIG. 15 and FIG. 16. The O-rings 182 come into contact with the rear surface of the processing target wafer W, the supporting wafer S, the superposed wafer T, and the O-rings 182 hold the rear surface of the processing target wafer W, the supporting wafer S, the superposed wafer T by the friction force between the O-rings 182 and the rear surface of the processing target wafer W, the supporting wafer S, the superposed wafer T. This enables the first transfer arm 170 to horizontally hold the processing target wafer W, the supporting wafer S, the superposed wafer T on the O-rings 182.

Guide members 183, 184 provided outside the processing target wafer W, the supporting wafer S, the superposed wafer T held on the O-rings 182 are provided on the arm unit 180. The first guide members 183 are provided at tips of the tip end parts 180a of the arm unit 180. The second guide member 184 is formed in an arc shape along the outer periphery of the processing target wafer W, the supporting wafer S, the superposed wafer T and provided on the support unit 181 side. The guide members 183, 184 can prevent the processing target wafer W, the supporting wafer S, the superposed wafer T from protruding from or slipping off the first transfer arm 170. Note that when the processing target wafer W, the supporting wafer S, the superposed wafer T is held at an appropriate position on the O-rings 182, the processing target wafer W, the supporting wafer S, the superposed wafer T never comes into contact with the guide members 183, 184.

The second transfer arm 171 transfers the supporting wafer S while holding the outer peripheral portion of the front surface thereof, namely, the joint surface $S_J$. More specifically, the second transfer arm 171 transfers the supporting wafer S while holding the outer peripheral portion of the joint surface $S_J$ of the supporting wafer S whose front and rear surfaces have been reversed by the reversing unit 111. The second transfer arm 171 has an arm unit 190 having a tip branched off into two tip end parts 190a, 190a, and a support unit 191 integrally formed with the arm unit 190 and supporting the arm unit 190 as illustrated in FIG. 17.

Figure 17:
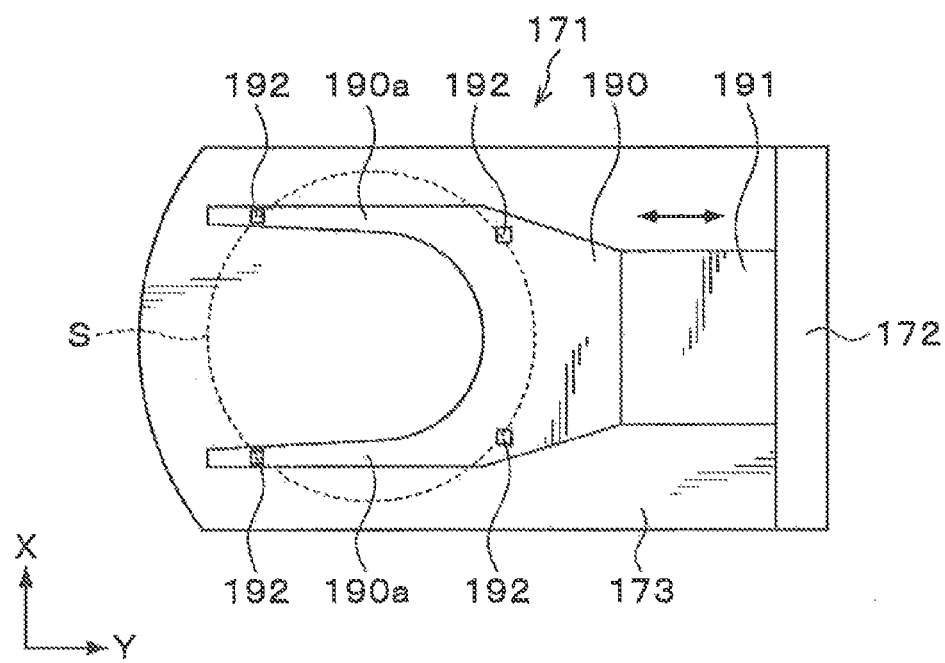
FIG. 17 is a plan view illustrating the outline of a configuration of a second transfer arm.
Figure 18:
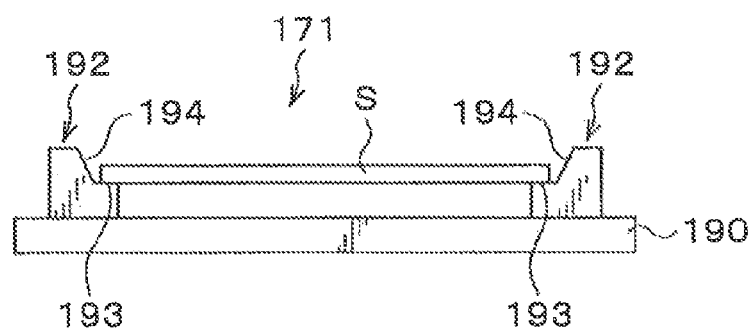
FIG. 18 is a side view illustrating the outline of the configuration of the second transfer arm.

On the arm unit 190, second holding members 192 are provided at a plurality of, for example, four positions as illustrated in FIG. 17 and FIG. 18. The second holding member 192 has a mounting part 193 on which the outer peripheral portion of the joint surface $S_J$ of the supporting wafer S is mounted and a tapered part 194 that extends upward from the mounting part 193 and has an inner side surface expanding in a tapered shape from the lower side to the upper side. The mounting part 193 holds the outer peripheral portion, for example, within 1 mm from the edge of the supporting wafer S. Further, since the inner side surface of the tapered part 194 expands in a tapered shape from the lower side to the upper side, the supporting wafer S can be smoothly guided by the tapered part 194 and positioned and held on the mounting part 193 even if the supporting wafer S delivered to the second holding member 192 is displaced from a predetermined position in the horizontal direction. The second transfer arm 171 can horizontally hold the supporting wafer S on the second holding members 192.

Figure 19:
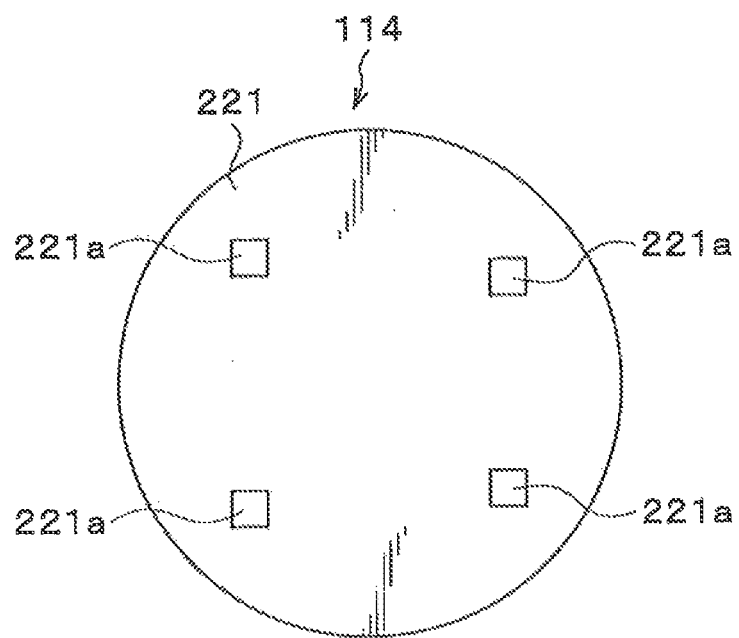
FIG. 19 is an explanatory view illustrating the appearance in which cutouts are formed in the second holding unit.

Note that cutouts 221a are formed, for example, at four positions in a later-described joint unit second holding unit 221 of the joint unit 114 as illustrated in FIG. 19. The cutouts 221a make it possible to prevent the second holding members 192 of the second transfer arm 171 from interfering with the second holding unit 221 when the supporting wafer S is delivered from the second transfer arm 171 to the second holding unit 221.

Figure 20:
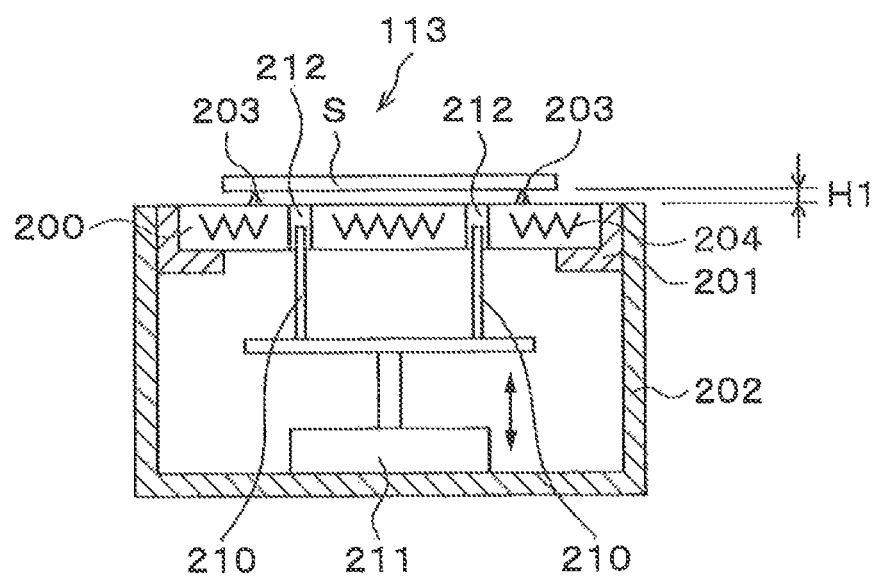
FIG. 20 is a longitudinal sectional view illustrating the outline of a configuration of a preheating unit.

Next, the configuration of the aforementioned preheating unit 113 will be described. The preheating unit 113 includes an annular holding member 201 that accommodates a thermal plate 200 as a thermal processing plate and holds the outer peripheral portion of the thermal plate 200, and a support ring 202 in an almost cylindrical shape that surrounds the outer periphery of the holding member 201 as illustrated in FIG. 20.

On the thermal plate 200, for example, support pins 203 for supporting the supporting wafer S are provided at a plurality of, for example, three positions. The support pins 203 keep a distance H1 between the supporting wafer S and the thermal plate 200 at 0.4 mm or more, 0.4 mm to this embodiment. The thermal plate 200 has an almost disk shape with a large thickness and can heat the supporting wafer S via the support pins 203. In the thermal plate 200, for example, a heating mechanism 204 is embedded. For the heating mechanism 204, for example, a heater is used. The heating temperature of the thermal plate 200 is controlled, for example, by a control unit 400 so that the supporting wafer S mounted on the thermal plate 200 is heated to a predetermined temperature.

Below the thermal plate 200, for example, three raising and lowering pins 210 for supporting the processing target wafer W from below and raising and lowering it are provided. The raising and lowering pins 210 can move up and down by means of a raising and lowering drive unit 211. Near the middle portion of the thermal plate 200, through holes 212 penetrating the thermal plate 200 in the thickness direction are formed, for example, at three positions. Then, the raising and lowering pins 210 can pass through the through holes 212 and project from the upper surface of the thermal plate 200.

Figure 21:
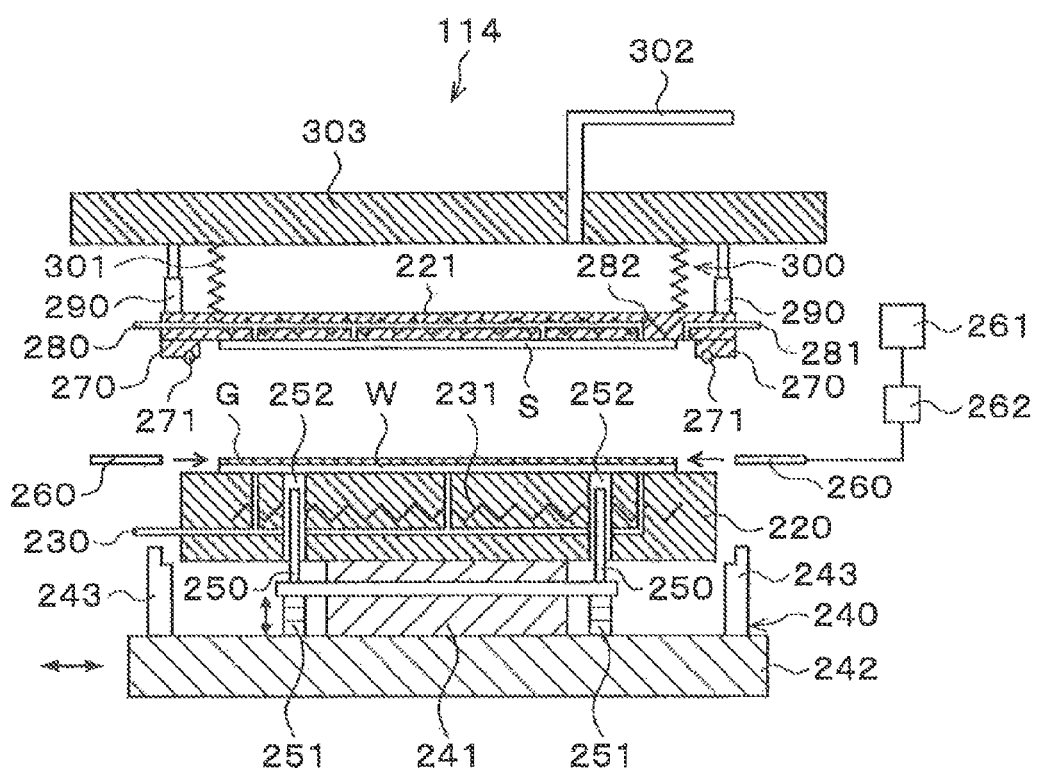
FIG. 21 is a longitudinal sectional view illustrating the outline of a configuration of a joint unit.

Next, the configuration of the aforementioned joint unit 114 will be described. The joint unit 114 has a first holding unit 220 that mounts the processing target wafer W on its upper surface and the second holding unit 221 that suction-holds the supporting wafer S on its lower surface as illustrated in FIG. 21. The first holding unit 220 is provided below the second holding unit 221 and disposed to face the second holding unit 221. In other words, the processing target wafer W held on the first holding unit 220 and the supporting wafer S held on the second holding unit 221 are arranged to face each other.

Inside the first holding unit 220, a suction pipe 230 for suction-holding the processing target wafer W is provided. The suction pipe 230 is connected to a negative pressure generating device (not illustrated) such as, for example, a vacuum pump. Note that for the first holding unit 220, a material having strength avoiding deformation even if a load is applied thereon by a later-described pressurizing mechanism 300, for example, ceramic such as silicon carbide ceramic, aluminum nitride ceramic or the like is used.

Further, inside the first holding unit 220, a heating mechanism 231 that heats the processing target wafer W is provided. For the heating mechanism 231, for example, a heater is used.

Below the first holding unit 220, a moving mechanism 240 that moves the first holding unit 220 and the processing target wafer W in the vertical direction and the horizontal direction is provided. The moving mechanism 240 can three-dimensionally move the first holding unit 220 with an accuracy of, for example, ±1 µm. The moving mechanism 240 has a vertical moving unit 241 that moves the first holding unit 220 in the vertical direction and a horizontal moving unit 242 that moves the first holding unit 220 in the horizontal direction. Each of the vertical moving unit 241 and the horizontal moving unit 242 has, for example, a ball screw (not illustrated) and a motor (not illustrated) that turns the ball screw.

On the horizontal moving unit 242, supporting members 243 capable of extending and contracting in the vertical direction are provided. The supporting members 243 are provided, for example, at three positions outside the first holding unit 220. The supporting members 243 can support a projection part 270 provided projecting from an outer peripheral lower surface of the second holding unit 221 as illustrated in FIG. 22.

Figure 22:
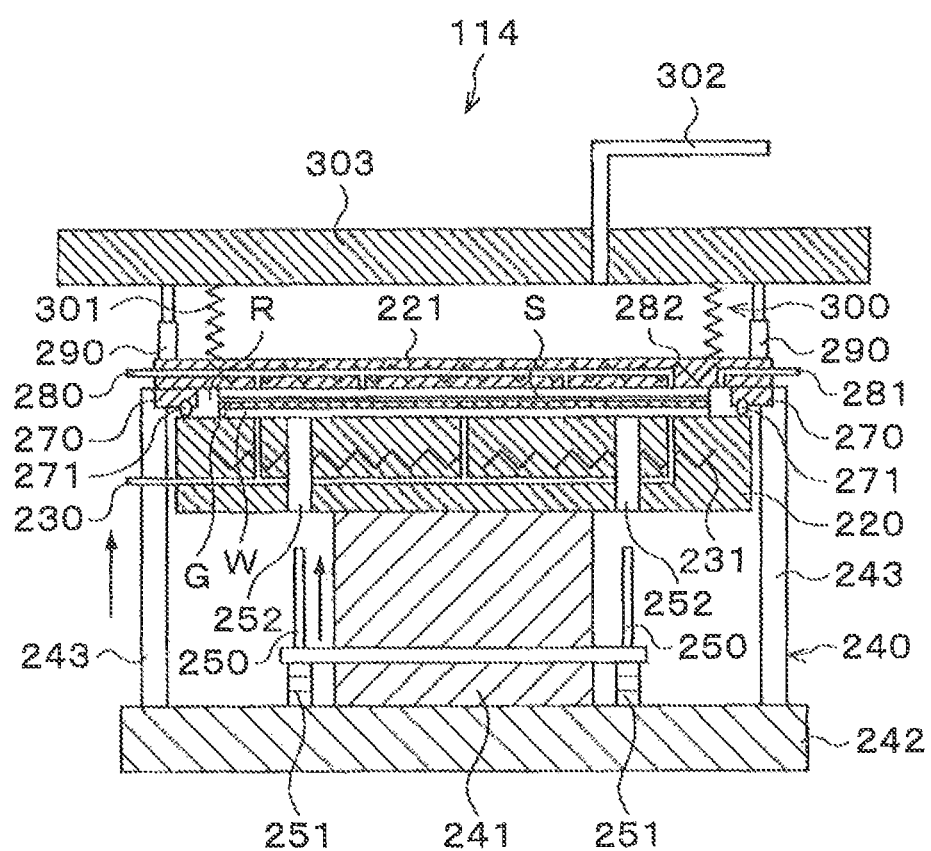
FIG. 22 is a longitudinal sectional view illustrating the outline of the configuration of the joint unit.

The above moving mechanism 240 can align the processing target wafer W on the first holding unit 220 in the horizontal direction, and raise the first holding unit 220 to form a joint space R for joining the processing target wafer W and the supporting wafer S together as illustrated in FIG. 22. The joint space R is a space surrounded by the first holding unit 220, the second holding unit 221 and the projection part 270. Further by adjusting the heights of the supporting members 243 when forming the joint space R, the distance in the vertical direction between the processing target wafer W and the supporting wafer S in the joint space R can be adjusted.

Below the first holding unit 220, for example, raising and lowering pins 250 for supporting the processing target wafer W from below and raising and lowering it are provided, for example, three positions as illustrated in FIG. 21. The raising and lowering pins 250 can move up and down by means of a drive unit 251. The drive unit 251 has a ball screw (not illustrated) and a motor (not illustrated) that turns the ball screw. Further, near the middle portion of the first holding unit 220, through holes 252 penetrating the first holding unit 220 in the thickness direction are formed, for example, at three positions. Then, the raising and lowering pins 250 can pass through the through holes 252 and project from the upper surface of the first holding unit 220.

Beside the first holding unit 220, gas supply pipes 260 that supply an inert gas such as, for example, a nitrogen gas to the processing target wafer held on the first holding unit 220 are provided at a plurality of positions. The gas supply pipes 260 communicate with a gas supply source 261 that stores the inert gas therein. Along the gas supply pipes 260, a supply equipment group 262 is provided which includes a valve, a flow regulator and so on that control the flow of the inert gas.

For the second holding unit 221, for example, aluminum that is an elastic body is used. The second holding unit 221 is configured such that when a predetermined pressure, for example, 0.7 atmosphere (=0.07 MPa) is applied on the entire surface of the second holding unit 221, a portion thereof, for example, a central portion bends as will be described later.

On the outer peripheral lower surface of the second holding unit 221, the aforementioned projection part 270 projecting downward from the outer peripheral lower surface is formed. The projection part 270 is formed along the outer periphery of the second holding unit 221. Note that the projection part 270 may be formed integrally with the second holding unit 221.

On the lower surface of the projection part 270, a sealing material 271 for keeping the air tightness of the joint space R is provided. The sealing material 271 is annually provided in a groove formed in the lower surface of the projection part 270 and, for example, an O-ring is used therefor. Further, the sealing material 271 has elasticity. Note that the sealing material 271 only needs to be a component having a sealing function and is not limited to this embodiment.

Inside the second holding unit 221, a suction pipe 280 for suction-holding the supporting wafer S is provided. The suction pipe 280 is connected to a negative pressure generating device (not illustrated) such as, for example, a vacuum pump.

Inside the second holding unit 221, a suction pipe 281 for sucking the atmosphere in the joint space R is provided. One end of the suction pipe 281 is opened in the lower surface of the second holding unit 221 at a location where the supporting wafer S is not held. The other end of the suction pipe 281 is connected to a negative pressure generating device (not illustrated) such as, for example, a vacuum pump.

Inside the second holding unit 221, a heating mechanism 282 that heats the supporting wafer S is provided. For the heating mechanism 282, for example, a heater is used.

On the upper surface of the second holding unit 221, supporting members 290 that support the second holding unit 221 and a pressurizing mechanism 300 that presses the second holding unit 221 vertically downward are provided. The pressurizing mechanism 300 has a pressure container 301 provided in a manner to cover the processing target wafer W and the supporting wafer S, and a fluid supply pipe 302 that supplies fluid, for example, compressed air into the pressure container 301. Further, the supporting members 290 are configured to be capable of extending and contracting in the vertical direction and provided, for example, at three positions outside the pressure container 301.

The pressure container 301 is composed of bellows made of, for example, stainless steel, which is capable of extending and contracting, for example, in the vertical direction. The pressure container 301 has a lower surface in abutment with the upper surface of the second holding unit 221 and an upper surface in abutment with the lower surface of a support plate 303 provided above the second holding unit 221. The fluid supply pipe 302 has one end connected to the pressure container 301 and the other end connected to a fluid supply source (not illustrated). Then, a fluid is supplied from the fluid supply pipe 302 into the pressure container 301, whereby the pressure container 301 extends. In this event, since the upper surface of the pressure container 301 is in abutment with the lower surface of the support plate 303, the pressure container 301 extends only downward to be able to press the second holding unit 221 provided on the lower surface of the pressure container 301 downward. Further, in this event, the inside of the pressure container 301 is pressurized by the fluid, so that the pressure container 301 can uniformly press the second holding unit 221. Adjustment of the load when pressing the second holding unit 221 is performed by adjusting the pressure of the compressed air to be supplied to the pressure container 301. Note that the support plate 303 is preferably composed of a member having strength avoiding deformation even if it receives the reaction force of the load applied on the second holding unit 221 by the pressurizing mechanism 300. Note that the support plate 303 of this embodiment may be omitted, and the upper surface of the pressure container 301 may be made in abutment with the ceiling surface of the processing container 100.

Note that the configurations of the joint apparatuses 31 to 33 are the same as that of the above-described joint apparatus 30, and therefore the description thereof is omitted.

Figure 23:
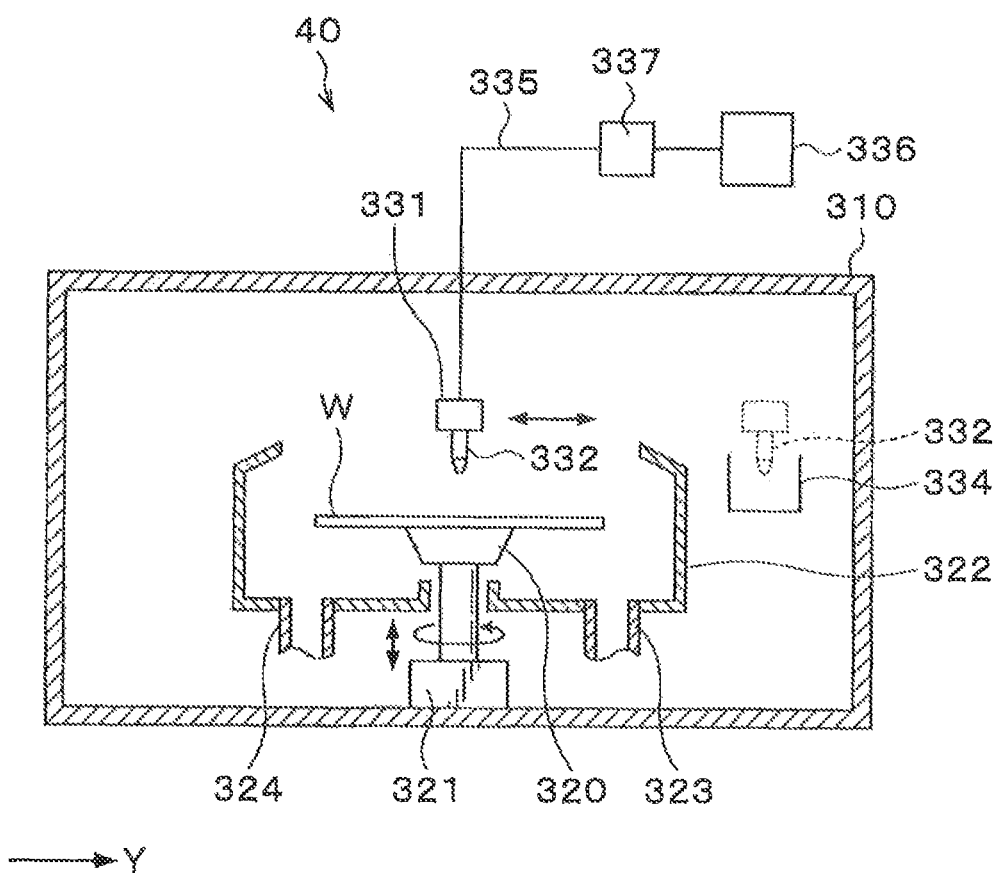
FIG. 23 is a longitudinal sectional view illustrating the outline of a configuration of a coating apparatus.

Next, the configuration of the aforementioned coating apparatus 40 will be described. The coating apparatus 40 has a treatment container 310 that can hermetically close the inside thereof as illustrated in FIG. 23. In the side surface on the wafer transfer region 60 side of the treatment container 310, a transfer-in/out port (not illustrated) for the processing target wafer is formed, and an opening/closing shutter (not illustrated) is provided at the transfer-in/out port.

At a central portion in the treatment container 310, a spin chuck 320 that holds and rotates the processing target wafer W thereon is provided. The spin chuck 320 has a horizontal upper surface, and a suction port (not illustrated) for sucking, for example, the processing target wafer W is provided in the upper surface. By suction through the suction port, the processing target wafer W can be suction-held on the spin chuck 320.

Below the spin chuck 320, a chuck drive unit 321 equipped with, for example, a motor and so on is provided. The spin chuck 320 can rotate at a predetermined speed by means of the chuck drive unit 321. The chuck drive unit 321 is provided with a raising and lowering drive source such as, for example, a cylinder and can freely raise and lower the spin chuck 320.

Around the spin chuck 320, a cup 322 is provided which receives and recovers liquid splashing or dropping from the processing target wafer W. A drain pipe 323 that drains the recovered liquid and an exhaust pipe 324 that vacuums and exhausts the atmosphere in the cup 322 are connected to the lower surface of the cup 322.

Figure 24:
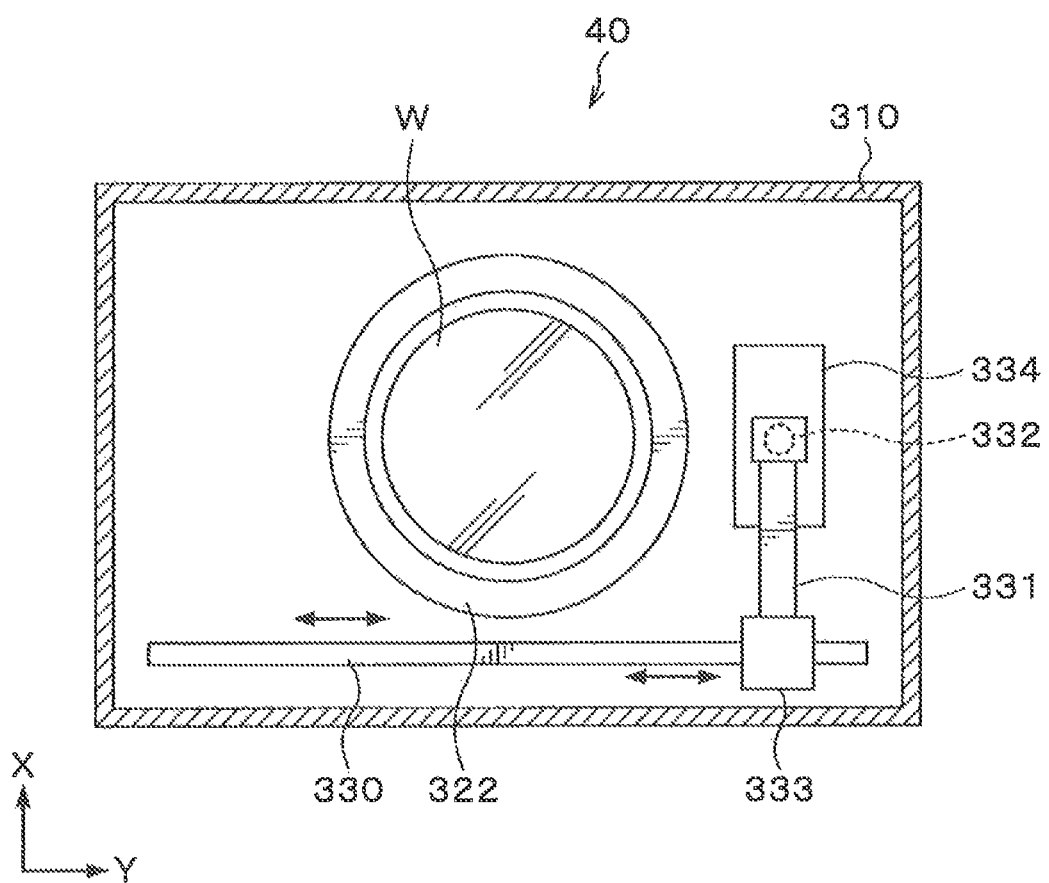
FIG. 24 is a transverse sectional view illustrating the outline of the configuration of the coating apparatus.

As illustrated in FIG. 24, on an X-direction negative direction (a lower direction in FIG. 24) side of the cup 322, a rail 330 extending along a Y-direction (a right-left direction in FIG. 24) is formed. The rail 330 is formed, for example, from a Y-direction negative direction (a left direction in FIG. 24) side outer position of the cup 322 to a Y-direction positive direction (a right direction in FIG. 24) side outer position. On the rail 330, for example, an arm 331 is attached.

On the arm 331, an adhesive nozzle 332 that supplies an adhesive G in a liquid state to the processing target wafer W is supported as illustrated in FIG. 23 and FIG. 24. The arm 331 is movable on the rail 330 by means of a nozzle drive unit 333 illustrated in FIG. 24. Thus, the adhesive nozzle 332 can move from a waiting section 334 provided at the Y-direction positive direction side outer position of the cup 322 to a position above a central portion of the processing target wafer W in the cup 322, and further move in the diameter direction of the processing target wafer W above the processing target wafer W. Further, the arm 331 can freely rise and lower by means of the nozzle drive unit 333 to be able to adjust the height of the adhesive nozzle 332.

To the adhesive nozzle 332, a supply pipe 335 that supplies the adhesive G to the adhesive nozzle 332 is connected as illustrated in FIG. 23. The supply pipe 335 communicates with an adhesive supply source 336 that stores the adhesive G therein. Along the supply pipe 335, a supply equipment group 337 is further provided which includes a valve, a flow regulator and so on that control the flow of the adhesive G.

A back rinse nozzle (not illustrated) that jets a cleaning solution. toward the rear surface of the processing target substrate W, namely, the non-joint surface $W_N$ may be provided below the spin chuck 320. The cleaning solution jetted from the back rinse nozzle cleans the non-joint surface $W_N$ of the processing target wafer W and the outer peripheral portion of the processing target substrate W.

Figure 25:
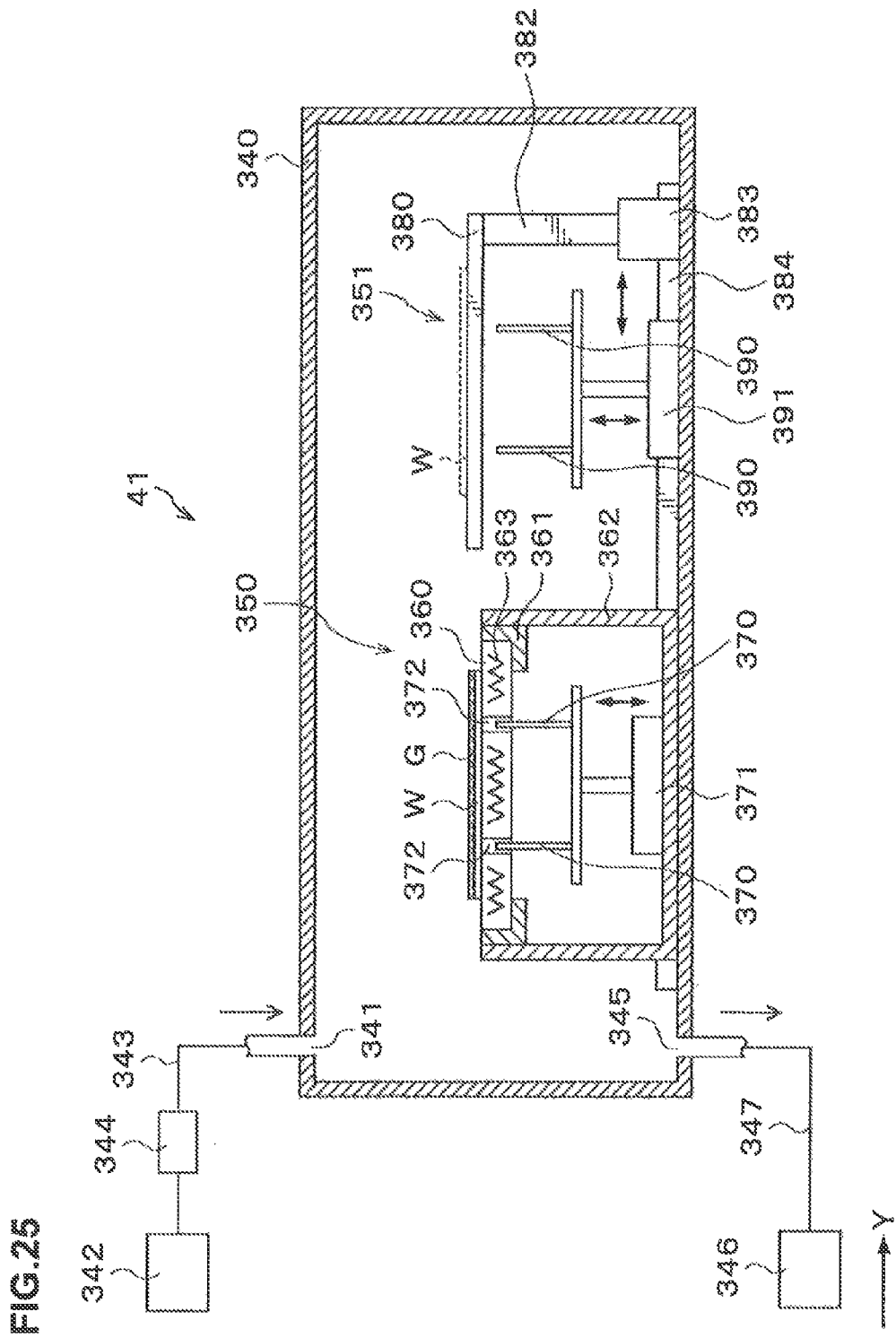
FIG. 25 is a longitudinal sectional view illustrating the outline of a configuration of a thermal processing apparatus.

Next, the configurations of the aforementioned thermal processing apparatuses 41 to 46 will be described. The thermal processing apparatus 41 has a processing container 340 that can hermetically close the inside thereof as illustrated in FIG. 25. In the side surface on the wafer transfer region 60 side of the processing container 340, a transfer-in/out port (not illustrated) for the processing target wafer W is formed, and an opening/closing shutter (not illustrated) is provided at the transfer-in/out port.

At the ceiling surface of the processing container 340, a gas supply port 341 for supplying an inert gas such as, for example, a nitrogen gas into the processing container 340 is formed. To the gas supply port 341, a gas supply pipe 343 communicating with a gas supply source 342 is connected. Along the gas supply pipe 343, a supply equipment group 344 is provided which includes a valve, a flow regulator and so on that control the flow of the inert gas.

At the bottom surface of the processing container 340, a suction port 345 for sucking the atmosphere in the processing container 340 is formed. A suction pipe 347 communicating with a negative pressure generating device 346 such as, for example, a vacuum pump is connected to the suction port 345.

Inside the processing container 340, a heating unit 350 that performs heat processing on the processing target wafer W and a temperature regulation unit 351 that temperature-regulates the processing target wafer W are provided. The heating unit 350 and the temperature regulation unit 351 are arranged side by side in the Y-direction.

The heating unit 350 includes an annular holding member 361 that accommodates a thermal plate 360 and holds the outer peripheral portion of the thermal plate 360, and a support ring 362 in an almost cylindrical shape that surrounds the outer periphery of the holding member 361. The thermal plate 360 has an almost disk shape with a large thickness and can mount and heat the processing target wafer W thereon. For example, a heater 363 is embedded in the thermal plate 360. The heating temperature of the thermal plate 360 is controlled, for example, by the control unit 400 so that the processing target wafer W mounted on the thermal plate 360 is heated to a predetermined temperature.

Below the thermal plate 360, for example, three raising and lowering pins 370 for supporting the processing target wafer W from below and raising and lowering it are provided. The raising and lowering pins 370 can move up and down by means of a raising and lowering drive unit 371. Near the middle portion of the thermal plate 360, through holes 372 penetrating the thermal plate 360 in the thickness direction are formed, for example, at three positions. Then, the raising and lowering pins 370 can pass through the through holes 372 and project from the upper surface of the thermal plate 360.

Figure 26:
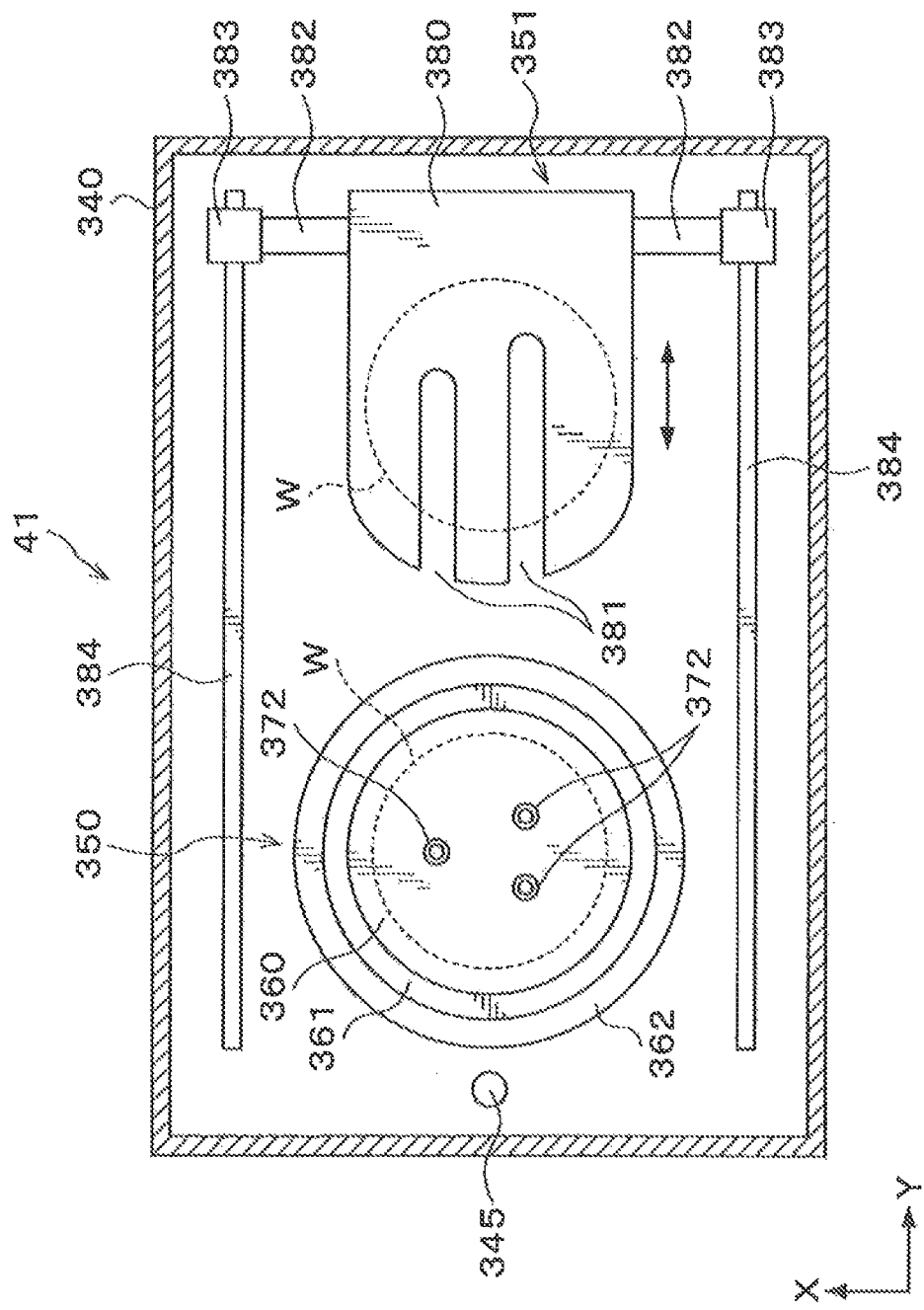
FIG. 26 is a transverse sectional view illustrating the outline of the configuration of the thermal processing apparatus.

The temperature regulation unit 351 has a temperature regulation plate 380. The temperature regulation plate 380 has an almost square flat plate shape as illustrated in FIG. 26 and has an end face on the thermal plate 360 side curved in an arc shape. In the temperature regulation plate 380, two slits 381 are formed along the Y-direction. The slits 381 are formed from the end face on the thermal plate 360 side of the temperature regulation plate 380 to the vicinity of the middle portion of the temperature regulation plate 380. The slits 381 can prevent the temperature regulation plate 380 from interfering with the raising and lowering pins 370 of the heating unit 350 and later-described raising and lowering pins 390 of the temperature regulation unit 351. Further, a temperature regulation member (not illustrated) such as a Peltier element is embedded in the temperature regulation plate 380. The cooling temperature of the temperature regulation plate 380 is controlled, for example, by the control unit 400 so that the processing target wafer W mounted on the temperature regulation plate 380 is cooled to a predetermined temperature.

The temperature regulation plate 380 is supported on a support arm 382 as illustrated in FIG. 25. To the support arm 382, a drive unit 383 is attached. The drive unit 383 is attached on a rail 384 extending in the Y-direction. The rail 384 extends from the temperature regulation unit 351 to the heating unit 350. By means of the drive unit 383, the temperature regulation plate 380 can move along the rail 384 between the heating unit 350 and the temperature regulation unit 351.

Below the temperature regulation plate 380, for example, three raising and lowering pins 390 for supporting the processing target wafer W from below and raising and lowering it are provided. The raising and lowering pins 390 can move up and down by means of a raising and lowering drive unit 391. Then, the raising and lowering pins 390 can pass through the slits 381 and project from the upper surface of the temperature regulation plate 380.

Note that the configurations of the thermal processing apparatuses 42 to 46 are the same as that of the above-described thermal processing apparatus 41, and therefore the description thereof is omitted.

In thermal processing apparatuses 41 to 46, the temperature regulation of the superposed wafer T can also be performed. Further, a temperature regulation apparatus (not illustrated) may be provided for temperature-regulating the superposed wafer T. The temperature regulation apparatus has the same configuration as that of the above-described thermal processing apparatus 41 and uses a temperature regulation plate in place of the thermal plate 360. Inside the temperature regulation plate, a cooling member such as a Peltier element is embedded and can regulate the temperature regulation plate to a set temperature.

In the above joint system 1, the control unit 400 is provided as illustrated in FIG. 1. The control unit 400 is, for example, a computer and has a program storage unit (not illustrated). In the program storage unit, a program is stored which controls the processing on the processing target wafer W, the supporting wafer S, the superposed wafer T in the joint system 1. Further, the program storage unit also stores a program that controls the operation of the driving system such as the above-described various processing and treatment apparatuses and transfer apparatuses to implement later-described joint processing in the joint system 1. Note that the program may be the one that is stored, for example, in a computer-readable storage medium H such as a computer-readable hard disk (HD), flexible disk (FD), compact disk (CD), magneto-optical disk (MO), or memory card, and installed from the storage medium H into the control unit 400.

Figure 27:
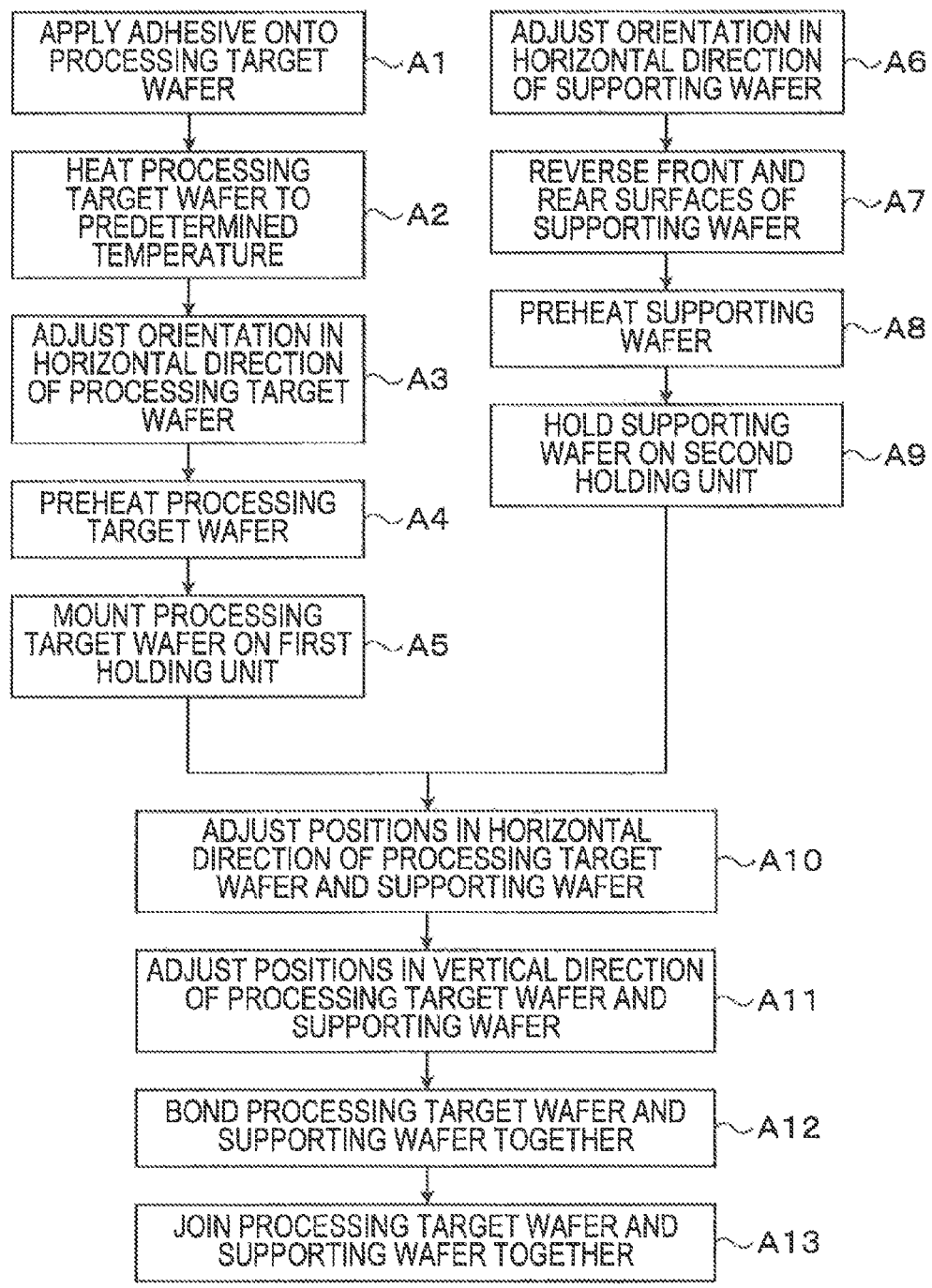
FIG. 27 is a flowchart illustrating main steps of joint processing.

Next, the joint processing method of the processing target wafer W and the supporting wafer S performed using the joint system 1 configured as described above will be described. FIG. 27 is a flowchart illustrating an example of main steps of the joint processing.

First, a cassette $C_W$ housing a plurality of processing target wafers W, a cassette $C_S$ housing a plurality of supporting wafers S, and an empty cassette $C_T$ are mounted on predetermined cassette mounting plates 11 in the transfer-in/out station 2. Then, a processing target wafer W in the cassette $C_W$ is taken out by the wafer transfer apparatus 22 and transferred to the transition apparatus 50 in the third processing block G3 of the processing station 3. In this event, the processing target wafer W is transferred with the non-joint surface $W_N$ facing downward.

Subsequently, the processing target wafer W is transferred by the wafer transfer apparatus 61 to the coating apparatus 40. The processing target wafer W transferred in the coating apparatus 40 is delivered from the wafer transfer apparatus 61 to the spin chuck 320 and suction-held thereon. In this event, the non-joint surface $W_N$ of the processing target wafer W is suction-held.

Subsequently, the arm 331 moves the adhesive nozzle 332 at the waiting section 334 to a position above a central portion of the processing target wafer W. Thereafter, while the processing target wafer W is being rotated by the spin chuck 320, the adhesive G is supplied from the adhesive nozzle 332 to the joint surface $W_J$ of the processing target wafer W. The supplied adhesive G is diffused over the entire joint surface $W_J$ of the processing target wafer W by the centrifugal force, whereby the adhesive G is applied over the joint surface $W_J$ of the processing target wafer W (Step A1 in FIG. 27).

Subsequently, the processing target wafer W is transferred by the wafer transfer apparatus 61 to the thermal processing apparatus 41. In this event, the atmosphere of the inert gas is maintained inside the thermal processing apparatus 41. After the processing target wafer W is transferred into the thermal processing apparatus 41, the processing target wafer W is delivered from the wafer transfer apparatus 61 to the raising and lowering pins 390 which have been raised and waiting in advance. Subsequently, the raising and lowering pins 390 are lowered to mount the processing target wafer W on the temperature regulation plate 380.

Thereafter, the temperature regulation plate 380 is moved by the drive unit 383 to above the thermal plate 360 along the rail 384, and the processing target wafer W is delivered to the raising and lowering pins 370 which have been raised and waiting in advance. Thereafter, the raising and lowering pins 370 are lowered to mount the processing target wafer W on the thermal plate 360. Then, the processing target wafer W on the thermal plate 360 is heated to a predetermined temperature, for example, 100° C. to 300° C. (Step A2 in FIG. 27). The heating performed by the thermal plate 360 heats the adhesive G on the processing target wafer W so that the adhesive G hardens.

Thereafter, the raising and lowering pins 370 are raised and the temperature regulation plate 380 is moved to above the thermal plate 360. Subsequently, the processing target wafer W is delivered from the raising and lowering pins 370 to the temperature regulation plate 380, and the temperature regulation plate 380 is moved to the wafer transfer region 60 side. During the movement of the temperature regulation plate 380, the processing target wafer W is temperature-regulated to a predetermined temperature, for example, room temperature (23° C.).

The processing target wafer W which has been subjected to thermal processing in the thermal processing apparatus 41 is transferred by the wafer transfer apparatus 61 to the joint apparatus 30. The processing target wafer W transferred to the joint apparatus 30 is delivered from the wafer transfer apparatus 61 to the delivery arm 120 of the delivery unit 110, and then further delivered from the delivery arm 120 to the wafer support pins 121. Then, the processing target wafer W is transferred by the first transfer arm 170 of the transfer unit 112 from the wafer support pins 121 to the reversing unit 111.

The processing target wafer W transferred to the reversing unit 111 is held by the holding members 151 and moved to the position adjusting mechanism 160. Then, in the position adjusting mechanism 160, the position of the notch portion of the processing target wafer W is adjusted, whereby the orientation in the horizontal direction of the processing target wafer W is adjusted (Step A3 in FIG. 27).

Figure 28:
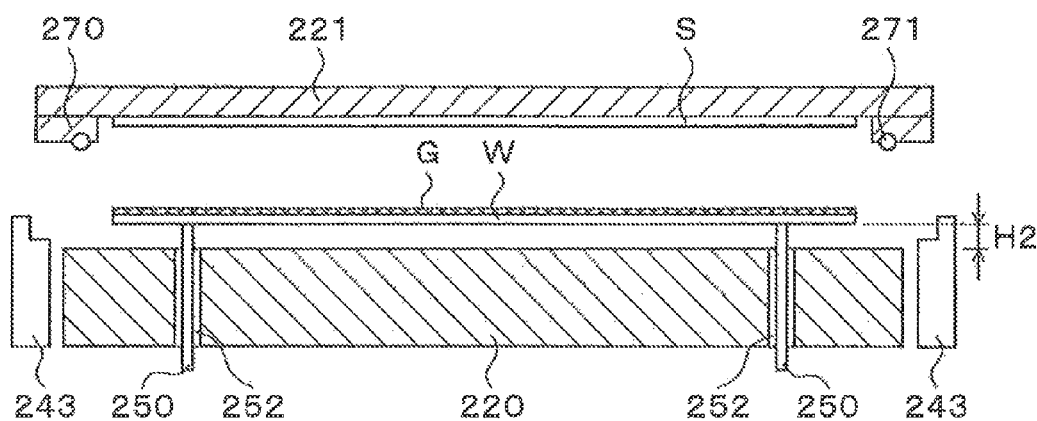
FIG. 28 is an explanatory view illustrating the appearance in which the processing target wafer is preheated.

Thereafter, the processing target wafer W is transferred by the first transfer arm 170 of the transfer unit 112 from the reversing unit 111 to the joint unit 114. The processing target wafer W transferred to the joint unit 114 is delivered from the first transfer arm 170 to the raising and lowering pins 250 which have been raised and waiting in advance. Subsequently, the raising and lowering pins 250 are lowered to dispose the processing target wafer W above the first holding unit 220 as illustrated in FIG. 28. In this event, a distance H2 between the processing target wafer W and the first holding unit 220 is kept at 0.4 mm or more, 0.4 mm in this embodiment. Further, from the gas supply pipes 260, the inert gas is supplied to the processing target wafer W. The inert gas can suppress oxidation of the joint surface $W_J$ (the adhesive G) of the processing target wafer W. Further, the processing target wafer W is preheated by the heating mechanism 231 of the first holding unit 220 to a predetermined temperature, for example, 150° C. (Step A4 in FIG. 27). Note that the first holding unit 220 functions as the preheating unit of the present invention in this embodiment.

Note that since the distance H2 between the processing target wafer W and the first holding unit 2.20 is 0.4 mm or more at Step A4, the position in the horizontal direction of the processing target wafer W is not displaced due to air existing between the processing target wafer W and the first holding unit 220 even when the processing target wafer W is lowered by the raising and lowering pins 250. In short, the orientation in the horizontal direction of the processing target wafer W adjusted at Step A3 is properly maintained.

Thereafter, the raising and lowering pins 250 are further lowered to mount the processing target wafer W on the first holding unit 220 (Step A5 in FIG. 27). On the first holding unit 220, the processing target wafer W is mounted with the joint surface $W_J$ of the processing target wafer W directed upward, namely, the adhesive G directed upward.

During the time when the above-described processing at Steps A1 to A5 is performed on the processing target wafer W, the supporting wafer S is subjected to processing subsequently to the processing target wafer W. The supporting wafer S is transferred by the wafer transfer apparatus 61 to the joint apparatus 30. Note that the step of transferring the supporting wafer S to the joint apparatus 30 is the same as that in the above embodiment, and therefore the description thereof is omitted.

The supporting wafer S transferred to the joint apparatus 30 is delivered from the wafer transfer apparatus 61 to the delivery arm 120 of the delivery unit 110, and then delivered from the delivery arm 120 to the wafer supporting pins 121. Thereafter, the supporting wafer S is transferred by the first transfer arm 170 of the transfer unit 112 from the wafer supporting pins 121 to the reversing unit 111.

The supporting wafer S transferred to the reversing unit 111 is held by the holding members 151 and moved to the position adjusting mechanism 160. Then, in the position adjusting mechanism 160, the position of the notch portion of the supporting wafer S is adjusted, whereby the orientation in the horizontal direction of the supporting wafer S is adjusted (Step A6 in FIG. 27). The supporting wafer S whose orientation in the horizontal direction has been adjusted is moved in the horizontal direction from the position adjusting mechanism 160 and moved upward in the vertical direction, and then the front and rear surfaces thereof are reversed (Step A7 in FIG. 27). In short, the joint surface $S_J$ of the supporting wafer S is directed downward.

Thereafter, the supporting wafer S is moved downward in the vertical direction and then transferred by the second transfer arm 171 of the transfer unit 112 from the reversing unit 111 to the preheating unit 113. In this event, the second transfer arm 171 holds only the outer peripheral portion of the joint surface $S_J$ of the supporting wafer S, so that the joint surface $S_J$ is never contaminated with, for example, particles adhering to the second transfer arm 171. The supporting wafer S transferred to the preheating unit 113 is delivered from the second transfer arm 171 to the raising and lowering pins 210 which have been raised and waiting in advance. Subsequently, the raising and lowering pins 210 are lowered and the supporting wafer S is supported on the support pins 203 on the thermal plate 200. In this event, the distance H1 between the supporting wafer S and the thermal plate 200 is kept at 0.4 mm or more 0.4 mm in this embodiment. Then, the supporting wafer S is preheated by the heating mechanism 204 of the thermal plate 200 to a predetermined temperature, for example 150° C. (Step A8 in FIG. 27). Note that since the supporting wafer S is finally separated from the processing target wafer W and not used for a product, it is not necessary to suppress the oxidation of the supporting wafer S at Step A8. Therefore, it is unnecessary at Step A8 to supply the insert gas to the supporting wafer S as at Step A4.

Since the distance H between the supporting wafer S and the thermal plate 200 is 0.4 mm or more at Step A8, the position in the horizontal direction of the supporting wafer S is not displaced due to air existing between the supporting wafer S and the thermal plate 200 even when the supporting wafer S is lowered by the raising and lowering pins 210. In short, the orientation in the horizontal direction of the supporting wafer S adjusted at Step A6 is properly maintained.

The supporting wafer S preheated at the preheating unit 113 is transferred by the second transfer arm 171 of the transfer unit 112 to the joint unit 114. The supporting wafer S transferred to the joint unit 114 is suction-held on the second holding unit 221 (Step A9 in FIG. 27). On the second holding unit 221, the supporting wafer S is held with the joint surface $S_J$ of the supporting wafer S directed downward.

In the joint apparatus 30, after the processing target wafer W and the supporting wafer S are held on the first holding unit 220 and the second holding unit 221 respectively, the position in the horizontal direction of the first holding unit 220 is adjusted by the moving mechanism 240 so that the processing target wafer W faces the supporting wafer S (Step A10 in FIG. 27). Note that in this event, the pressure between the second holding unit 221 and the supporting wafer S is, for example, 0.1 atmosphere (=0.01 MPa). Further, the pressure applied on the upper surface of the second holding unit 221 is 1.0 atmosphere (=0.1 MPa) that is the atmospheric pressure. To maintain the atmospheric pressure applied on the upper surface of the second holding unit 221, the pressure in the pressure container 301 of the pressurizing mechanism 300 may be the atmospheric pressure, or a gap may be formed between the upper surface of the second holding unit 221 and the pressure container 301.

Figure 29:
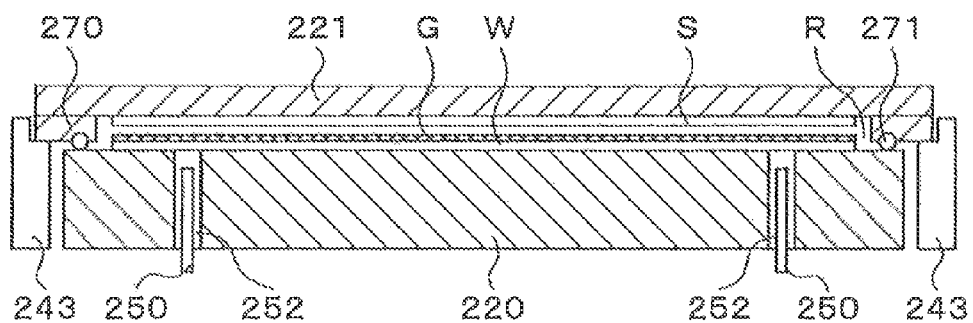
FIG. 29 is an explanatory view illustrating the appearance in which the first holding unit is raised.

Then, as illustrated in FIG. 29, the first holding unit 220 is raised by the moving mechanism 240 and the supporting members 243 are extended, whereby the second holding unit 221 is supported by the supporting members 243. In this event, by adjusting the heights of the supporting members 243, the distance in the vertical direction between the processing target wafer W and the supporting wafer S is adjusted to be a predetermined distance (Step A11 in FIG. 27). Note that this predetermined distance is the height ensuring that the central portion of the supporting wafer S comes into contact with the processing target wafer W when the sealing material 271 comes into contact with the first holding unit 220 and the central portions of the second holding unit 221 and the supporting wafer S bend as will be described later. In this manner, the sealed joint space R is formed between the first holding unit 220 and the second holding unit 221.

Figure 30:
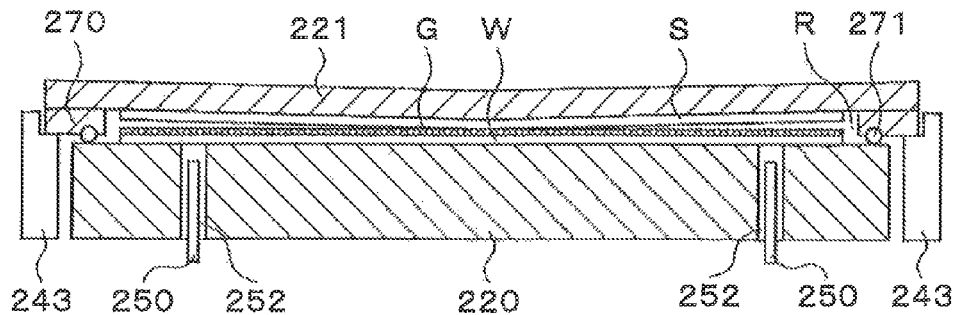
FIG. 30 is an explanatory view illustrating the appearance in which the central portion of the second holding unit bends.

Thereafter, the atmosphere in the joint space R is sucked from the suction pipe 281. Then, once the pressure in the joint space R is reduced, for example, to 0.3 atmosphere (=0.03 MPa), the pressure difference between the pressure applied on the upper surface of the second holding unit 221 and the pressure in the joint space R, namely, 0.7 atmosphere (=0.07 MPa) is applied on the second holding unit 221. Then, the central portion of the second holding unit 221 bends as illustrated in FIG. 30, and the central portion of the supporting wafer S held on the second holding unit 221 also bends. Note that since the pressure between the second holding unit 221 and the supporting wafer S is 0.1 atmosphere (=0.01 MPa) even when the pressure in the joint space R is reduced down to 0.3 atmosphere (=0.03 MPa), the supporting wafer S is kept held on the second holding unit 221.

Figure 31:
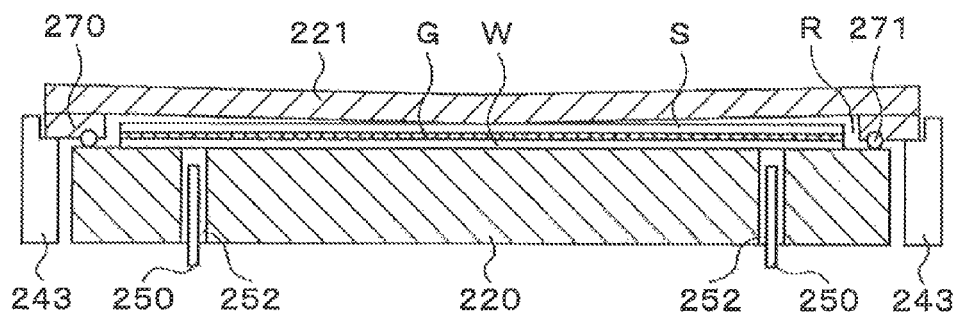
FIG. 31 is an explanatory view illustrating the appearance in which the entire joint surface of the supporting wafer is in abutment with the entire joint surface of the processing target wafer.

Thereafter, the atmosphere in the joint space R is sucked to reduce the pressure in the joint space R. Then, when the pressure in the joint space R becomes 0.1 atmosphere (=0.01 MPa) or lower, the second holding unit 221 cannot hold the supporting wafer S any longer, so that the supporting wafer S falls down as illustrated in FIG. 31 and the entire joint surface $S$ of the supporting wafer S comes into abutment with the entire joint surface $W_J$ of the processing target wafer W. In this event, the supporting wafer S comes into abutment with the processing target wafer W in sequence from the abutted central portion toward the outside in the diameter direction. In other words, even when air that can be a void exists in the joint space R, the air exists at all times outside the position where the supporting wafer S is in abutment with the processing target wafer W, thereby making it possible to expel the air from between the processing target wafer W and the supporting wafer S. In this manner, the processing target wafer W and the supporting wafer S are bonded together with the adhesive G while suppressing the occurrence of a void (Step A12 in FIG. 27).

Figure 32:
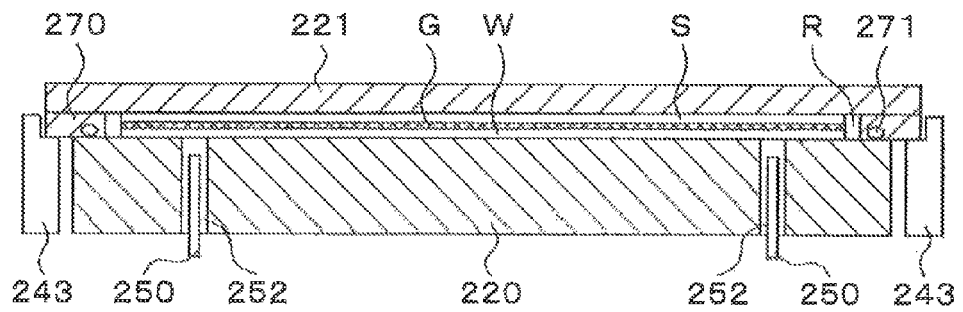
FIG. 32 is an explanatory view illustrating the appearance in which the processing target wafer and the supporting wafer are joined together.

Thereafter, as illustrated in FIG. 32, the heights of the supporting members 243 are adjusted to bring the lower surface of the second holding unit 221 into contact with the non-joint surface $S_N$ of the supporting wafer S. In this event, the sealing material 271 elastically deforms to bring the first holding unit 220 and the second holding unit 221 into close contact. Then, while the heating mechanisms 231, 282 are heating the processing target wafer W and the supporting wafer S to a predetermined temperature, for example, 200° C. to 250° C., the pressurizing mechanism 300 presses the second holding unit 221 downward at a predetermined pressure, for example, 0.5 MPa. Thus, the processing target wafer W and the supporting wafer S are more tightly bonded and joined together (Step A13 in FIG. 27).

The superposed wafer T in which the processing target wafer W and the supporting wafer S are joined together is transferred by the first transfer arm 170 of the transfer unit 112 from the joint unit 114 to the delivery unit 110. The superposed wafer T transferred to the delivery unit 110 is delivered via the wafer support pins 121 to the delivery arm 120 and further delivered from the delivery arm 120 to the wafer transfer apparatus 61.

Then, the superposed wafer T is transferred by the wafer transfer apparatus 61 to the thermal processing apparatus 42. The superposed wafer T is then temperature-regulated to a predetermined temperature, for example, room temperature (23° C.) in the thermal processing apparatus 42. The superposed wafer T is then transferred by the wafer transfer apparatus 61 to the transition apparatus 51 and then transferred by the wafer transfer apparatus 22 in the transfer-in/out station 2 to the cassette $C_T$ on the predetermined cassette mounting plate 11. Thus, a series of joint processing on the processing target wafer W and the supporting wafer S ends.

According to the above embodiment, the processing target wafer is preheated at Step A4, so that even when the processing target wafer W is suction-held on the first holding unit 220, the thermal expansion of the processing target wafer W can be suppressed. Therefore, it is possible to suppress particles generated by rubbing of the processing target wafer W and the first holding unit 220 against each other in this embodiment more than in the conventional case where the processing target wafer W at room temperature is heated by the first holding unit.

Similarly, the supporting wafer S is preheated at Step A8, so that even when the supporting wafer S is then suction-held on the second holding unit 221, the thermal expansion of the supporting wafer S can be suppressed. Therefore, it is possible to suppress particles generated by rubbing of the supporting wafer S and the second holding unit 221 against each other.

According to the above embodiment, the generation of the particles can be suppressed as described above, so that the joining of the processing target wafer W and the supporting wafer S can be properly performed.

Further, since the processing target wafer W is preheated at Step A4 directly before the processing target wafer W is mounted on the first holding unit 220 at Step A5, the temperature of the preheated processing target wafer W never decreases. Further, the oxidation of the joint surface $W_J$ (the adhesive G) of the processing target wafer W can be suppressed. Furthermore, it is possible to suppress adherence of the adhesive G improved in flowability due to heating to the mechanism such as the transfer arm. As described above, the processing target wafer W can be properly preheated.

The distance H2 between the processing target wafer W and the first holding unit 220 is 0.4 mm or more at Step A4, so that even when the processing target wafer W is lowered by the raising and lowering pins 250, the position in the horizontal direction of the processing target wafer W is not displaced due to air existing between the processing target wafer W and the first holding unit 220. In short, the orientation in the horizontal direction of the processing target wafer W adjusted at Step A3 is properly maintained. Furthermore, the distance H between the supporting wafer S and the thermal plate 200 is 0.4 mm or more at Step A8, so that even when the supporting wafer S is lowered by the raising and lowering pins 210, the position in the horizontal direction of the supporting wafer S is not displaced due to air existing between the supporting wafer S and the thermal plate 200. In short, the orientation in the horizontal direction of the supporting wafer S adjusted at Step A6 is properly maintained. Accordingly, the joining of the processing target wafer W and the supporting wafer S can be further properly performed.

The inert gas is supplied from the gas supply pipes 260 to the processing target wafer W at Step A4. In other words, the preheating on the processing target wafer W is performed in the inert gas atmosphere. Therefore, the oxidation of the joint surface $W_J$ (the adhesive G) of the processing target wafer W can be suppressed, and the joining of the processing target wafer W and the supporting wafer S can be further properly performed.

Further, since the joint system 1 has the joint apparatuses 30 to 33, the coating apparatus 40, and the thermal processing apparatuses 41 to 46, the processing target wafers W are successively processed such that the adhesive G is applied to the processing target wafer W and heated to a predetermined temperature and the front and rear surfaces of the supporting wafer S are reversed in the joint apparatus 30. Thereafter, the processing target wafer W to which the adhesive G has been applied and which has been heated to a predetermined temperature and the supporting wafer S whose front and rear surfaces have been reversed are joined together in the joint apparatus 30. According to this embodiment, the processing target wafer W and the supporting wafer S can be processed in parallel as described above. Further, while the processing target wafer W and the supporting wafer S are joined together in the joint apparatus 30, another processing target wafer W and another supporting wafer S can also be processed in the coating apparatus 40, the thermal processing apparatus 41, and the joint apparatus 30. Accordingly, it is possible to efficiently perform the joining of the processing target wafer W and the supporting wafer S and improve the throughput of the joint processing.

Though the processing target wafer W is preheated by the heating mechanism 231 of the first holding unit 220 at Step A4 in the above embodiment, the processing target wafer W may be preheated at the preheating unit 113.

Figure 33:
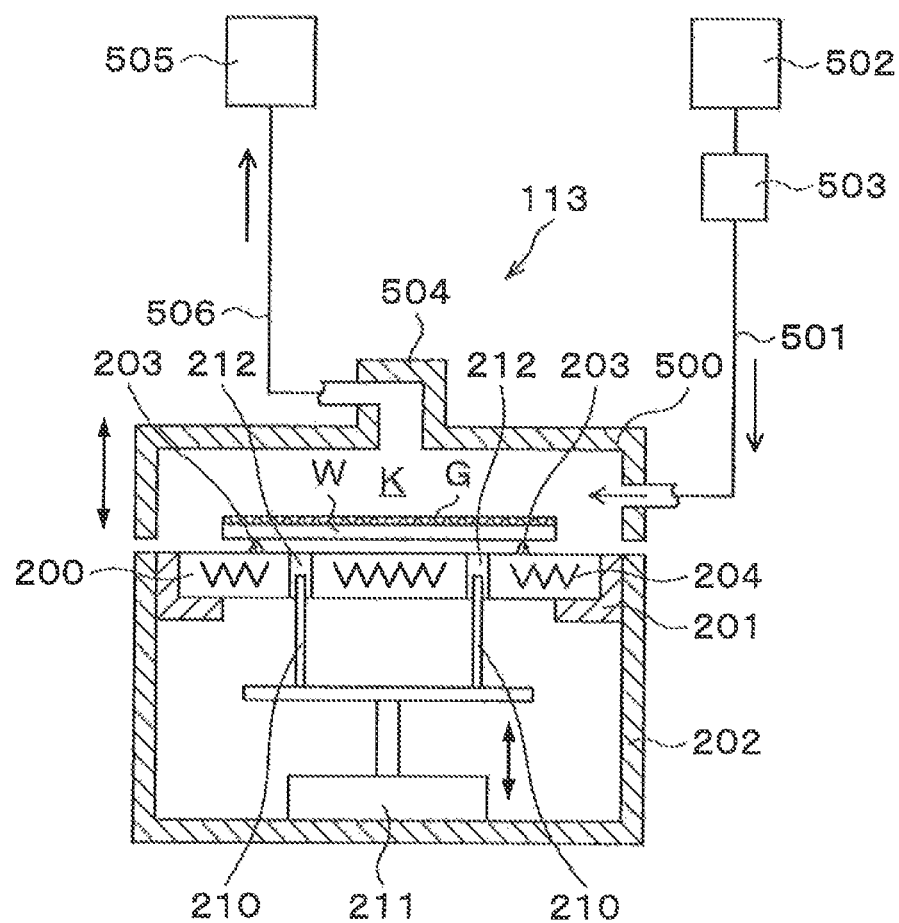
FIG. 33 is a transverse sectional view illustrating the outline of a configuration of a preheating unit according to another embodiment.

In this case, a lid body 500 capable of moving up and down is provided above the thermal plate 200 at the preheating unit 113 as illustrated in FIG. 33. The lid body 500 has a lower surface opened and forms a thermal processing chamber K together with the thermal plate 200, the holding member 201, and the support ring 202. The thermal processing chamber K is configured to be capable of hermetically closing the inside thereof.

To the side surface of the lid body 500, a gas supply pipe 501 that supplies an inert gas such as, for example, a nitrogen gas into the thermal processing chamber K is connected. The gas supply pipe 501 communicates with a gas supply source 520 that stores the inert gas therein. Along the gas supply pipe 501, a supply equipment group 503 is provided which includes a valve, a flow regulator and so on that control the flow of the inert gas.

Above the thermal plate 200 and at a middle portion of a ceiling surface of the lid body 500, an exhaust unit 504 that exhausts the atmosphere in the thermal processing chamber K is provided. To the exhaust unit 504, an exhaust pipe 506 communicating with a negative pressure generating device 505 such as, for example, a vacuum pump is connected. Note that the other configuration of the preheating unit 113 is the same as that of the preheating unit 113 in the above embodiment, and therefore the description thereof is omitted.

Then, at Step A4, the processing target wafer W is transferred by the first transfer arm 170 of the transfer unit 112 from the reversing unit 111 to the preheating unit 113. The processing target wafer W transferred to the preheating unit 113 is delivered from the first transfer arm 170 to the raising and lowering pins 210 which have been raised and waiting in advance. Subsequently, the raising and lowering pins 210 are lowered and the processing target wafer W is supported on the support pins 203 on the thermal plate 200. In this event, the distance H1 between the processing target wafer W and the thermal plate 200 is kept at 0.4 mm or more, 0.4 mm in this embodiment. Then, the lid body 500 is closed to form the thermal processing chamber K whose inside is hermetically closed. Subsequently, the atmosphere inside the thermal processing chamber K is exhausted from the exhaust unit 504, and the inert gas is supplied from the gas supply pipe 501 into the thermal processing chamber K to replace the inside of the thermal processing chamber K with the atmosphere of the inert gas. Then, the processing target wafer W is preheated by the heating mechanism 204 of the thermal plate 200 to a predetermined temperature, for example, 150° C.

The other Steps A1 to A3, A5 to A13 are the same as Steps A1 to A3, A5 to A13 in the above embodiment, and therefore the description thereof is omitted. Note that though the thermal processing chamber K is not formed at Step A8 in the above embodiment, the thermal processing chamber K may be formed and preheating on the supporting wafer S may be performed at Step A8 in this embodiment as at Step A4. In this case, however, the supply of the inert gas from the gas supply pipe 501 into the thermal processing chamber K can be omitted. Further, preheating on the supporting wafer S may be performed in the atmospheric atmosphere without closing the lid body 500 at Step A8.

According to this embodiment, since the processing target wafer W and the supporting wafer S are preheated at Steps A4, A8 respectively, the thermal expansion of the processing target wafer W and the supporting wafer S on the first holding unit 220 and the second holding unit 221 can be suppressed. Accordingly, the generation of the particles can be suppressed, so that the joining of the processing target wafer W and the supporting wafer S can be properly performed.

Note that the joint apparatus 30 may have both of the preheating unit 113 that preheats the supporting wafer S illustrated in FIG. 20 and the preheating unit 113 that preheats the processing target wafer W illustrated in FIG. 33. In this case, the processing target wafer W and the supporting wafer S can be preheated in parallel, so that the throughput of the processing target wafer W and the supporting wafer S can be further improved.

Though the supporting wafer S is preheated at the preheating unit 113 at Step A8 in the above embodiment, the supporting wafer S may be preheated by the second holding unit 221.

Figure 34:
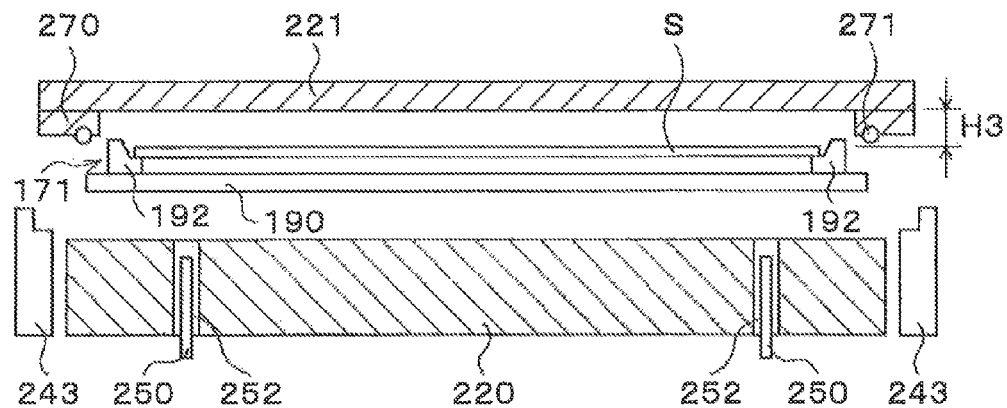
FIG. 34 is an explanatory view illustrating the appearance in which the supporting wafer is preheated in another embodiment.

In this case, the supporting water S is transferred by the second transfer arm 171 of the transfer unit 112 from the reversing unit 111 to the joint unit 114 at Step A8. Then, the second transfer arm 171 is raised to dispose the supporting wafer S below the second holding unit 221 as illustrated ion FIG. 34. In this event, a distance H3 between the supporting wafer S and the second holding unit 221 is kept at 0.4 mm or more, 0.4 mm in this embodiment. Then, the supporting wafer S is preheated by the heating mechanism 282 of the second holding unit 221 to a predetermined temperature, for example, 150° C.

Figure 35:
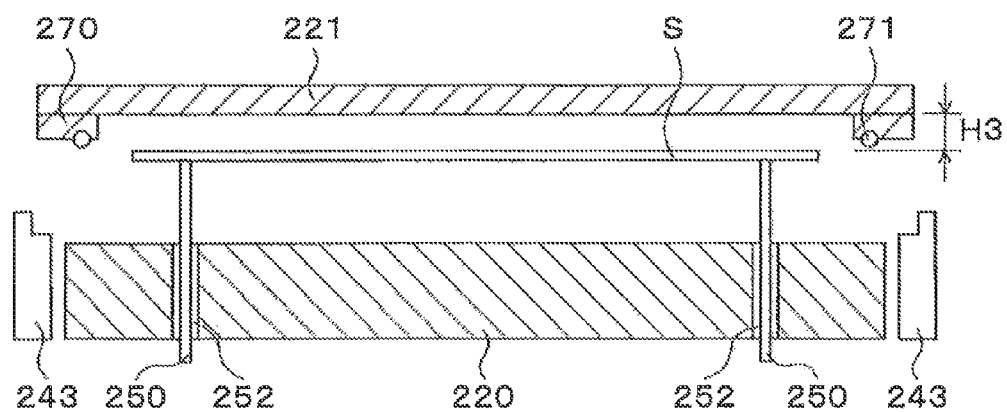
FIG. 35 is an explanatory view illustrating the appearance in which the supporting wafer is preheated in another embodiment.

Alternatively, the supporting wafer S is transferred by the second transfer arm 171 of the transfer unit 112 from the reversing unit 111 to the joint unit 114 at Step A8. The supporting wafer S transferred to the joint unit 114 is delivered from the second transfer arm 171 to the raising and lowering pins 250 which have been raised and waiting in advance. Subsequently, the raising and lowering pins 250 are raised to dispose the supporting wafer S below the second holding unit 221 as illustrated ion FIG. 35. In this event, the distance H3 between the supporting wafer S and the second holding unit 221 is kept at 0.4 mm or more, 0.4 mm in this embodiment. Then, the supporting wafer S is preheated by the heating mechanism 282 of the second holding unit 221 to a predetermined temperature, for example, 150° C.

Note that in any of the case where the supporting water S is supported by the second transfer arm 171 and the case where the supporting wafer S is supported on the raising and lowering pins 250 at Step A8, the supporting wafer S is not preheated by the heating mechanism 282 of the second holding unit 221 but may be preheated by the heating mechanism 231 of the first holding unit 220. In this case, the supporting wafer S to be reheated is disposed such that the distance between the supporting wafer S and the first holding unit 220 is 0.4 mm or more. The other Steps A1 to A7, A9 to A13 are the same as Steps A1 to A7, A9 to A13 in the above embodiment, and therefore the description thereof is omitted.

According to this embodiment, in any of the case where the supporting wafer S is supported by the second transfer arm 171 and the case where the supporting wafer S is supported on the raising and lowering pins 250 at Step A8, the supporting wafer S can be preheated. More specifically, the processing target wafer W and the supporting wafer S are preheated at Steps A4, A8 respectively, so that the thermal expansion of the processing target wafer W and the supporting wafer S on the first holding unit 220 and the second holding unit 221 can be suppressed. Accordingly, it is possible to suppress generation of particles and properly perform the joining of the processing target wafer W and the supporting wafer S.

Further, the distance H3 between the supporting wafer S and the second holding unit 221 is 0.4 mm or more at Step A8, so that even when the supporting wafer S is then raised by the second transfer arm 171 or the raising and lowering pins 250, the position in the horizontal direction of the supporting wafer S is not displaced due to air existing between the supporting wafer S and the second holding unit 221. Accordingly, the joining of the processing target wafer W and the supporting wafer S can be further properly performed.

The preheating unit 113 is arranged in the joint region D2 in the joint apparatuses 30 to 33 in the above embodiment, but may be arranged in the pre-processing region D1, The preheating unit 113 is stacked above or below the delivery unit 110 and the reversing unit 111 in the pre-processing region D1. In this case, the footprint of the joint apparatus 30 can be reduced.

In the joint system 1 of the above embodiment, the thermal processing apparatuses 41 to 46 may be omitted and the processing performed in the thermal processing apparatuses 41 to 46 may be performed inside the joint apparatuses 30 to 33. In this case, the processing by the heating unit 350 in the thermal processing apparatus 41 is performed, for example, by the preheating unit 113 in the joint apparatus 30. At this time, the preheating unit 113 is stacked above or below the delivery unit 110 and the reversing unit 111. Further, the processing by the temperature regulation unit 351 in the thermal processing apparatus 41 is performed, for example, by the delivery arm 120 in the joint apparatus 30 or a temperature regulation unit separately stacked above or below the delivery unit 110 and the reversing unit 111. When this processing is performed by the delivery arm 120, a temperature regulating member such as a Peltier element is embedded in the delivery arm 120. On the other hand, when this processing is performed by the temperature regulation unit, the temperature regulation unit has the same configuration as that of the preheating unit 113, and the temperature regulation unit is provided with a temperature-regulation plate having a temperature regulation member such as a Peltier element in place of the thermal plate 200 of the preheating unit 113.

Also in this case, the processing target wafer W and the supporting wafer S are preheated at Steps A4, A8 respectively, and the joining of the processing target wafer W and the supporting wafer S can be properly performed.

Though the inert gas is supplied from the gas supply pipes 260, 501 to the processing target wafer W at Step A4 in the above embodiment, the inert gas may be supplied into the processing container 100 to bring the inside of the processing container 100 into the inert gas atmosphere.

Though the processing target wafer W and the supporting wafer S are joined together with the processing target wafer W arranged on the lower side and the supporting wafer S arranged on the upper side in the above embodiment, the vertical arrangement of the processing target wafer W and the supporting wafer S may be reversed. In this case, the above-described Steps A1 to A5 are performed on the supporting wafer S and the adhesive G is applied on the joint surface S$_J$ of the supporting wafer S. Further, the above-described Steps A6 to A9 are performed on the processing target wafer W and the front and rear surfaces of the processing target wafer W are reversed. Then, the above-described Steps A10 to A13 are performed to join the supporting wafer S and the processing target wafer W together. However, it is preferable to apply the adhesive G on the processing target wafer W from the viewpoint of protecting the electronic circuits and the like on the processing target wafer W.

Though the adhesive G is applied on one of the processing target wafer W and the supporting wafer S in the coating apparatus 40 in the above embodiment, the adhesive G may be applied on both of the processing target wafer W and the supporting wafer S.

Though the processing target wafer W is heated to a predetermined temperature of 100° C. to 300° C. at Step A3 in the above embodiment, the thermal processing on the processing target wafer W may be performed at two stages. For example, the processing target wafer W is heated to a first thermal processing temperature, for example, 100° C. to 150° C. in the thermal processing apparatus 41, and then heated to a second thermal processing temperature, for example, 150° C. to 300° C. in the thermal processing apparatus 44. In this case, the temperatures of the heating mechanisms themselves in the thermal processing apparatus 41 and the thermal processing apparatus 44 can be fixed. Accordingly, it is unnecessary to temperature-regulate the heating mechanisms so as to further improve the throughput of the joint processing on the processing target wafer W and the supporting wafer S.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention. The present invention is not limited to the embodiments but may take various forms. The present invention is also applicable to the case where the processing target substrate is a substrate other than the wafer, such as an FPD (Flat Panel Display), a mask reticle for a photomask or the like. The present invention is also applicable to the case where the supporting substrate is a substrate other than the wafer, such as a glass substrate or the like.

What is claimed is:

1. A joint apparatus comprising a first holding unit that suction-holds a processing target substrate and a second holding unit that is arranged to face the first holding unit and suction-holds a supporting substrate and joining the processing target substrate and the supporting substrate together by pressing the second holding unit toward the first holding unit while heating the substrates by heating mechanisms of the holding units, said apparatus comprising:
   a preheating unit that preheats at least the processing target substrate before the processing target substrate is suction-held on said first holding unit;
   a raising and lowering pin that is provided below said first holding unit, penetrates said first holding unit to freely rise and lower, and supports the processing target substrate,
   wherein said preheating unit is said first holding unit, and
   wherein the preheating on the processing target substrate is performed by heating the processing target substrate by the heating mechanism of said first holding unit with the processing target substrate disposed above said first holding unit by said raising and lowering pin.

2. The joint apparatus as set forth in claim 1,
   wherein when the preheating is performed on the processing target substrate, a distance between a top surface of said first holding unit and a bottom surface of the processing target substrate is at least 0.4 mm.

3. The joint apparatus as set forth in claim 1,
   wherein the preheating on the processing target substrate is performed in an inert gas atmosphere.

4. The joint apparatus as set forth in claim 1, further comprising:
   a thermal processing plate that heats the supporting substrate,
   wherein the supporting substrate is preheated by said thermal processing plate before the supporting substrate is suction-held on said second holding unit.

5. The joint apparatus as set forth in claim 4,
   wherein when the preheating is performed on the supporting substrate, a distance between a top surface of said thermal processing plate and a bottom surface of the supporting substrate is at least 0.4 mm.

6. The joint apparatus as set forth in claim 1, further comprising:
   a transfer arm that transfers the supporting substrate to said second holding unit,
   wherein the supporting substrate is preheated by the heating mechanism of said second holding unit with the supporting substrate disposed below said second holding unit by said transfer arm before the supporting substrate is suction-held on said second holding unit.

7. The joint apparatus as set forth in claim 1, further comprising:
   a raising and lowering pin that is provided below said first holding unit, penetrates said first holding unit to freely rise and lower, and supports the processing target substrate, and
   wherein the supporting substrate is preheated by the heating mechanism of said second holding unit with the supporting substrate disposed below said second holding unit by said raising and lowering pin before the supporting substrate is suction-held on said second holding unit.

8. A joint apparatus comprising a first holding unit that suction-holds a processing target substrate and a second holding unit that is arranged to face the first holding unit and suction-holds a supporting substrate and joining the processing target substrate and the supporting substrate together by pressing the second holding unit toward the first holding unit while heating the substrates by heating mechanisms of the holding units, said apparatus comprising:
- a preheating unit that preheats at least the processing target substrate before the processing target substrate is suction-held on said first holding unit,
- wherein said preheating unit has a thermal processing plate that heats the processing target substrate, and
- wherein the preheating on the processing target substrate is performed by heating the processing target substrate by said thermal processing plate.

9. The joint apparatus as set forth in claim 8,
- wherein said preheating unit has a support pin that is provided on said thermal processing plate and supports the processing target substrate, and
- wherein when the preheating is performed on the processing target substrate supported by said support pin, a distance between a top surface of said thermal processing plate and a bottom surface of the processing target substrate is at least 0.4 mm.

10. The joint apparatus as set forth in claim 8,
- wherein the preheating on the processing target substrate is performed in an inert gas atmosphere.

11. The joint apparatus as set forth in claim 8, further comprising:
- a thermal processing plate that heats the supporting substrate,
- wherein the supporting substrate is preheated by said thermal processing plate before the supporting substrate is suction-held on said second holding unit.

12. The joint apparatus as set forth in claim 11,
- wherein when the preheating is performed on the supporting substrate, a distance between a top surface of said thermal processing plate and a bottom surface of the supporting substrate is at least 0.4 mm.

13. The joint apparatus as set forth in claim 8, further comprising:
- a transfer arm that transfers the supporting substrate to said second holding unit,
- wherein the supporting substrate is preheated by the heating mechanism of said second holding unit with the supporting substrate disposed below said second holding unit by said transfer arm before the supporting substrate is suction-held on said second holding unit.

14. The joint apparatus as set forth in claim 8, further comprising:
- a raising and lowering pin that is provided below said first holding unit, penetrates said first holding unit to freely rise and lower, and supports the processing target substrate, and
- wherein the supporting substrate is preheated by the heating mechanism of said second holding unit with the supporting substrate disposed below said second holding unit by said raising and lowering pin before the supporting substrate is suction-held on said second holding unit.

15. A joint system comprising a joint apparatus comprising a first holding unit that suction-holds a processing target substrate and a second holding unit that is arranged to face the first holding unit and suction-holds a supporting substrate and joining the processing target substrate and the supporting substrate together by pressing the second holding unit toward the first holding unit while heating the substrates by heating mechanisms of the holding units, said system comprising:
- a processing station and a transfer-in/out station that transfers the processing target substrate, the supporting substrate, or a superposed substrate in which the processing target substrate and the supporting substrate are joined together into/out of said processing station, wherein said processing station comprises:
- a coating apparatus that applies an adhesive to the processing target substrate or the supporting substrate;
- a thermal processing apparatus that heats the processing target substrate or the supporting substrate to which the adhesive has been applied to a predetermined temperature; and
- a transfer region for transferring the processing target substrate, the supporting substrate, or the superposed substrate, to the coating apparatus, the thermal processing apparatus, and the joint apparatus, and
- wherein the joint apparatus has a preheating unit that preheats at least the processing target substrate before the processing target substrate is suction-held on the first holding unit.

* * * * *